(12) United States Patent
Cook

(10) Patent No.: US 12,113,554 B2
(45) Date of Patent: Oct. 8, 2024

(54) LOW COMPLEXITY OPTIMAL PARALLEL HUFFMAN ENCODER AND DECODER

(71) Applicant: Samsung Display Co., Ltd., Yongin-si (KR)

(72) Inventor: Gregory William Cook, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 211 days.

(21) Appl. No.: 17/939,643

(22) Filed: Sep. 7, 2022

(65) Prior Publication Data

US 2024/0022260 A1    Jan. 18, 2024

Related U.S. Application Data

(60) Provisional application No. 63/388,352, filed on Jul. 12, 2022.

(51) Int. Cl.
*H03M 7/40* (2006.01)
*H03M 7/30* (2006.01)
*H03M 7/42* (2006.01)

(52) U.S. Cl.
CPC ....... *H03M 7/4093* (2013.01); *H03M 7/3079* (2013.01); *H03M 7/40* (2013.01);
(Continued)

(58) Field of Classification Search
CPC .... H03M 7/4093; H03M 7/42; H03M 7/3079; H03M 7/405; H03M 7/4062;
(Continued)

(56) References Cited

U.S. PATENT DOCUMENTS

| | | | |
|---|---|---|---|
| 5,973,626 | A | 10/1999 | Berger et al. |
| 6,690,306 | B1 * | 2/2004 | Acharya ................. H03M 7/40 341/67 |

(Continued)

FOREIGN PATENT DOCUMENTS

WO    2021162722 A1    8/2021

OTHER PUBLICATIONS

European Search Report for EP Application No. 23182994.6 dated Nov. 17, 2023, 13 pages.
(Continued)

*Primary Examiner* — Khai M Nguyen
(74) *Attorney, Agent, or Firm* — Lewis Roca Rothgerber Christie LLP

(57) ABSTRACT

A memory device includes a memory; and at least one processor configured to: obtain a symbol stream including a plurality of symbols; determine a Huffman tree corresponding to the symbol stream, wherein each symbol of the plurality of symbols is assigned a corresponding prefix code from among a plurality of prefix codes based on the Huffman tree; generate a prefix length table based on the Huffman tree, wherein the prefix length table indicates a length of the corresponding prefix code for each symbol; generate a logarithm frequency table based on the prefix length table, wherein the logarithm frequency table indicates a logarithm of a frequency count for each symbol, generate a cumulative frequency table which indicates a cumulative frequency count corresponding to each symbol; generate a compressed bitstream by iteratively applying an encoding function to the plurality of symbols based on the logarithm frequency table and the cumulative frequency table; and store the compressed bitstream in the memory.

24 Claims, 27 Drawing Sheets

(52) U.S. Cl.
    CPC ......... *H03M 7/405* (2013.01); *H03M 7/4062*
           (2013.01); *H03M 7/42* (2013.01); *H03M*
           *7/6017* (2013.01); *H03M 7/6023* (2013.01);
                                    *G06F 2212/401* (2013.01)

(58) Field of Classification Search
    CPC .... H03M 7/6023; H03M 7/40; H03M 7/6017;
                                           G06F 2212/401
    See application file for complete search history.

(56) References Cited

U.S. PATENT DOCUMENTS

| | | | |
|---|---|---|---|
| 7,609,179 | B2 | 10/2009 | Diaz-Gutierrez et al. |
| 9,584,156 | B1 * | 2/2017 | Abali ..................... H03M 7/42 |
| 9,881,625 | B2 | 1/2018 | Liu et al. |
| 10,607,617 | B2 | 3/2020 | Kawashima et al. |
| 10,700,702 | B2 | 6/2020 | Camp et al. |
| 10,756,758 | B1 | 8/2020 | Abali et al. |
| 10,812,102 | B2 | 10/2020 | Cornelius et al. |
| 2019/0273508 | A1 | 9/2019 | Bennett et al. |
| 2019/0348999 | A1 | 11/2019 | Pal et al. |

OTHER PUBLICATIONS

Moffat, et al. "Large-Alphabet Semi-Static Entropy Coding Via Asymmetric Numeral Systems," ACM Transactions on Information Systems, vol. 38 (No. 4, article 33), Jul. 2020, 33 pages.

Wikipedia, "Huffman Coding," retrieved from https://en.wikipedia.org/w/index.php?title=Huffman_coding&oldid=1090852889, May 31, 2022, 6 pages.

* cited by examiner

| A | G | M | T | E | H | I | I | S |
|---|---|---|---|---|---|---|---|---|
| 1 | 1 | 1 | 1 | 2 | 2 | 3 | 3 | 5 |

| Symbol | Length | Bitstream | Freq. | Log freq |
|---|---|---|---|---|
| S | (2) | 11 | 4 | 2 |
| E | (3) | 010 | 2 | 1 |
| H | (3) | 011 | 2 | 1 |
| I | (3) | 100 | 2 | 1 |
| A | (3) | 101 | 2 | 1 |
| G | (4) | 0000 | 1 | 0 |
| M | (4) | 0001 | 1 | 0 |
| T | (4) | 0010 | 1 | 0 |
| | (4) | 0011 | 1 | 0 |

FIG. 4D

```
int msub(unsigned int v)
{
    unsigned int v;                      // 32-bit value to find the log2 of
    register unsigned int r; // result of log2(v) will go here
    register unsigned int shift;

r =     (v > 0xFFFF) << 4; v >>= r;
    shift = (v > 0xFF  ) << 3; v >>= shift; r |= shift;
    shift = (v > 0xF   ) << 2; v >>= shift; r |= shift;
    shift = (v > 0x3   ) << 1; v >>= shift; r |= shift;
                                            r |= (v >> 1);
    return r;
}
```

```
d = 0;
if (mssb(x)-z[s]>=b) {    // replaces while x >= Fs B loop
  d = (((mssb(x) – z[s]) >> a)<<a;  // number of bits to transfer
  writebits(ptr, x&((1<<d)-1), d);
  x = x >> d;
}
```

FIG. 9C

```
d = 0;
if (n-mssb(x)>0) { // replaces while x < N loop
    d = ((n-mssb(x)+((1<<a)-1)) >> a)<<a; // bits to transfer, need ceiling
    v = readbits(ptr, d);
    x = (x<<d) + v;
}
```

LOW COMPLEXITY OPTIMAL PARALLEL HUFFMAN ENCODER AND DECODER

CROSS-REFERENCE TO RELATED APPLICATION(S)

This application is based on and claims priority under 35 U.S.C. § 119 to U.S. Provisional Application No. 63/388,352, filed on Jul. 12, 2022, the disclosure of which is incorporated herein by reference in its entirety.

TECHNICAL FIELD

The disclosure relates to techniques for encoding and decoding digital data, for example compressing and decompressing digital data for storage in a memory device.

BACKGROUND

Memory devices, for example embedded memory devices, may make use of coding techniques such as entropy coding. Entropy coding may refer to a type of lossless coding used to compress digital data. In entropy coding, frequently occurring patterns are coded with fewer bits, and rarely occurring patterns are coded with many bits. The limit to lossless compression is known as the Shannon limit.

Due to the removal of redundant information, entropy coding is typically difficult to operate in parallel, especially in decoders. Although some general parallel techniques do exist, for example resynchronous markers, substream multiplexing, and parallel resynchronization, these techniques are typically complex to implement.

Therefore, there is a need for an embedded memory coding/decoding or compression/decompression algorithm which has a low memory space requirement, low complexity, high throughput (for example by being parallizable), and having near optimum compression.

SUMMARY

In accordance with some embodiments, a memory device includes a memory; and at least one processor configured to: obtain a symbol stream including a plurality of symbols, determine a Huffman tree corresponding to the symbol stream, wherein each symbol of the plurality of symbols is assigned a corresponding prefix code from among a plurality of prefix codes based on the Huffman tree, generate a prefix length table based on the Huffman tree, wherein the prefix length table indicates a length of the corresponding prefix code for each symbol, generate a logarithm frequency table based on the prefix length table, wherein the logarithm frequency table indicates a logarithm of a frequency count for each symbol, generate a cumulative frequency table which indicates a cumulative frequency count corresponding to each symbol, generate a compressed bitstream by iteratively applying an encoding function to the plurality of symbols based on the logarithm frequency table and the cumulative frequency table, and store the compressed bitstream in the memory.

To generate the logarithm frequency table, the at least one processor may be further configured to subtract the length of the corresponding prefix code for each symbol from a maximum length of the plurality of prefix codes.

The generate the cumulative frequency table, the at least one processor may be further configured to: obtain the frequency count of each symbol by left shifting an integer value of 1 based on the logarithm of the frequency count for each symbol, and obtain the cumulative frequency count for each symbol by adding the frequency count of each symbol to a sum of frequency counts of previous symbols of the plurality of symbols.

To apply the encoding function to each symbol, the at least one processor may be further configured to: obtain a current state value, obtain a shifted state value by right shifting the current state value based on the logarithm of the frequency count for each symbol, obtain a first value by left shifting the shifted state value based on a maximum length of the plurality of prefix codes, obtain the frequency count for each symbol by left shifting an integer value of 1 based on the logarithm of the frequency count, obtain a second value by performing a bitwise AND operation on the current state value and the frequency count for each symbol minus 1, and obtain an updated state value by adding the first value, the second value, and the cumulative frequency count corresponding to each symbol.

To apply the encoding function to each symbol, the at least one processor may be further configured to: determine whether a difference between a most significant set bit of an initial state value corresponding to the symbol stream and the logarithm of the frequency count corresponding to each symbol is greater than or equal to a minimum bit length of a codeword corresponding to the symbol stream, and based on determining that the difference is greater than or equal to the minimum bit length of the codeword: determine a third value by subtracting the logarithm of the frequency count for each symbol from the most significant set bit, obtain a shifted third value by right shifting the third value based on a logarithm of the minimum bit length of the codeword, determine a number of bits to be transferred out of the initial state value by left shifting the shifted third value based on the logarithm of the minimum bit length of the codeword, output the determined number of bits to the compressed bitstream, and obtain the current state value by right shifting the initial state value based on the determined number of bits.

The at least one processor may include a plurality of processors configured to perform the encoding function in parallel for the plurality of symbols, wherein, to perform the encoding function, each processor of the plurality of processors may be assigned a corresponding initial state value, wherein after each processor determines the number of bits to be transferred from the corresponding initial state value, each processor may be assigned a corresponding memory location to output the determined number of bits, and wherein after the determined number of bits are output to the compressed bitstream, each processor may be further configured to determine a corresponding current state value.

In accordance with some embodiments, a memory device includes a memory; and at least one processor configured to: obtain a compressed bitstream from the memory, wherein the compressed bitstream corresponds to a symbol stream including a plurality of symbols, obtain a logarithm frequency table from the compressed bitstream, wherein the logarithm frequency table indicates a logarithm of a frequency count for each symbol of the plurality of symbols, generate a cumulative frequency table based on the logarithm frequency table, wherein the cumulative frequency table indicates a cumulative frequency count corresponding to each symbol, generate an inverse symbol table based on the logarithm frequency table and the cumulative frequency table, and generate the symbol stream by iteratively applying a decoding function to the plurality of symbols based on the cumulative frequency table and the inverse symbol table.

To generate the cumulative frequency table, the at least one processor may be further configured to: obtain the frequency count of each symbol by left shifting an integer value of 1 based on the logarithm of the frequency count for each symbol, and obtain the cumulative frequency count for each symbol by adding the frequency count of each symbol to a sum of frequency counts of previous symbols of the plurality of symbols.

To generate the inverse symbol table, the at least one processor may be further configured to determine, for each symbol, an inverse symbol value by performing a bitwise AND operation on a current state value and a maximum length of a plurality of prefix codes corresponding to the compressed bitstream minus 1, wherein the inverse symbol value is greater than or equal to the cumulative frequency count of each symbol, and wherein the inverse symbol value is less than a cumulative frequency count of a next symbol.

To apply the decoding function to each symbol, the at least one processor may be further configured to: obtain each symbol based on the inverse symbol value corresponding to each symbol from the inverse symbol table, obtain a shifted state value by right shifting the current state value based on the maximum length of the plurality of prefix codes, obtain a first value by left shifting the shifted state value based on the logarithm of the frequency count for each symbol, obtain a total frequency count by left shifting an integer value of 1 based on the maximum length of the plurality of prefix codes, obtain a second value by performing a bitwise AND operation on the current state value and the maximum length of the plurality of prefix codes minus 1, and obtain an updated state value by subtracting the cumulative frequency count corresponding to each symbol from a sum of the second value and the inverse symbol value.

To apply the decoding function to each symbol, the at least one processor may be further configured to: determine a difference between the maximum length of the plurality of prefix codes and a most significant set bit of an initial state value corresponding to the compressed bitstream is greater than 0, and based on determining that the difference is greater than 0: obtain a third value by left shifting an integer value of 1 based on a logarithm of a minimum bit length of a codeword corresponding to the symbol stream, obtain a fourth value by adding the difference to the third value minus 1, obtain a shifted fourth value by right shifting the fourth value based on the logarithm of the minimum bit length of the codeword, determine a number of bits to be transferred into the initial state value by left shifting the shifted fourth value based on the logarithm of the minimum bit length of the codeword, obtain additional bits from the compressed bitstream based on the determined number of bits; and obtain a shifted state value by left shifting the initial state value based on the determined number of bits, and obtain the current state value by adding the shifted state value and the additional bits.

The at least one processor may include a plurality of processors configured to perform the decoding function in parallel for the plurality of symbols, wherein, to perform the decoding function, each processor of the plurality of processors may be assigned a corresponding initial state value, wherein after each processor determines the number of bits to be transferred into the corresponding initial state value, each processor may be assigned a corresponding memory location from which to obtain the additional bits, and wherein after the additional bits are obtained from the compressed bitstream, each processor may be further configured to determine a corresponding current state value.

In accordance with some embodiments, a method of compressing a symbol stream for storage in a memory device is performed by at least one processor and includes obtaining the symbol stream comprising a plurality of symbols; determining a Huffman tree corresponding to the symbol stream, wherein each symbol of the plurality of symbols is assigned a corresponding prefix code from among a plurality of prefix codes based on the Huffman tree; generating a cumulative frequency table which indicates a cumulative frequency count corresponding to each symbol; generating a compressed bitstream by iteratively applying an encoding function to the plurality of symbols based on the prefix length table and the cumulative frequency table; and storing the compressed bitstream in the memory device.

The generating of the logarithm frequency table may include subtracting the length of the corresponding prefix code for each symbol from a maximum length of the plurality of prefix codes.

The generating of the cumulative frequency table may include: obtaining the frequency count of each symbol by left shifting an integer value of 1 based on the logarithm of the frequency count for each symbol; and obtaining the cumulative frequency count for each symbol by adding the frequency count of each symbol to a sum of frequency counts of previous symbols of the plurality of symbols.

The applying of the encoding function to each symbol may include: obtaining a current state value; obtaining a shifted state value by right shifting the current state value based on the logarithm of the frequency count for each symbol; obtaining a first value by left shifting the shifted state value based on the maximum length of the plurality of prefix codes; obtaining the frequency count for each symbol by left shifting an integer value of 1 based on the logarithm of the frequency count; obtaining a second value by performing a bitwise AND operation on the current state value and the frequency count for each symbol minus 1; and obtaining an updated state by adding the first value, the second value, and the cumulative frequency count corresponding to each symbol.

The applying of the encoding function to each symbol may further include: determining whether a difference between a most significant set bit of an initial state value corresponding to the symbol stream and the logarithm of the frequency count corresponding to each symbol is greater than or equal to a minimum bit length of a codeword corresponding to the symbol stream; and based on determining that the difference is greater than or equal to the minimum bit length of the codeword: determining a third value by subtracting the logarithm of the frequency count for each symbol from the most significant set bit; obtaining a shifted third value by right shifting the third value based on a logarithm of the minimum bit length of the codeword; determining a number bits to be transferred out of the initial state value by left shifting the shifted third value based on the logarithm of the minimum bit length of the codeword; outputting the determined number of bits to the compressed bitstream; and obtaining the current state value by right shifting the initial state value based on the determined number of bits.

The at least one processor may include a plurality of processors, wherein the encoding function is applied in parallel by the plurality of processors for the plurality of symbols, wherein, to perform the encoding function, each processor of the plurality of processors may be assigned a corresponding initial state value, wherein after each processor determines the number of bits to be transferred from the corresponding initial state value, each processor may be assigned a corresponding memory location to output the determined number of bits, and wherein after the determined number of bits are output to the compressed bitstream, the method may further include determining a corresponding current state value for each processor.

In accordance with some embodiments, a method of generating a symbol stream based on a compressed bitstream is performed by at least one processor and includes obtaining the compressed bitstream from a memory, wherein the compressed bitstream corresponds to a plurality of symbols included in the symbol stream; obtaining a logarithm frequency table from the compressed bitstream, wherein the logarithm frequency table indicates a logarithm of a frequency count for each symbol of the plurality of symbols; generating a cumulative frequency table based on the logarithm frequency table, wherein the cumulative frequency table indicates a cumulative frequency count corresponding to each symbol; generating an inverse symbol table based on the logarithm frequency table and the cumulative frequency table; and generating the symbol stream by iteratively applying a decoding function to the plurality of symbols based on the cumulative frequency table and the inverse symbol table.

The generating of the cumulative frequency table may include: obtaining the frequency count of each symbol by left shifting an integer value of 1 based on the logarithm of the frequency count for each symbol; and obtaining the cumulative frequency count for each symbol by adding the frequency count of each symbol to a sum of frequency counts of previous symbols of the plurality of symbols.

The generating of the inverse symbol table may further include determining, for each symbol, an inverse symbol value by performing a bitwise AND operation on a current state value and a maximum length of a plurality of prefix codes corresponding to the compressed bitstream minus 1, wherein the inverse symbol value is greater than or equal to the cumulative frequency count of each symbol, and wherein the inverse symbol value is less than a cumulative frequency count of a next symbol.

The applying of the decoding function to each symbol may include: obtaining each symbol based on the inverse symbol value corresponding to each symbol from the inverse symbol table; obtaining a shifted state value by right shifting the current state value based on the maximum length of the plurality of prefix codes; obtaining a first value by left shifting the shifted state value based on the logarithm of the frequency count for each symbol; obtaining a total frequency count by left shifting an integer value of 1 based on the maximum length of the plurality of prefix codes; obtaining a second value by performing a bitwise AND operation on the current state value and the maximum length of the plurality of prefix codes minus 1; and obtaining an updated state value by subtracting the cumulative frequency count corresponding to each symbol from a sum of the second value and the inverse symbol value.

The applying of the decoding function to each symbol may further include: determining whether a difference between the maximum length of the plurality of prefix codes and a most significant set bit of an initial state value corresponding to the compressed bitstream is greater than 0; based on determining that the difference is greater than 0: obtaining a third value by left shifting an integer value of 1 based on a logarithm of a minimum bit length of a codeword corresponding to the symbol stream; obtaining a fourth value by adding the difference to the third value minus 1; obtaining a shifted fourth value by right shifting the third value based on the logarithm of the minimum bit length of the codeword, determining a number of bits to be transferred into the initial state value by left shifting the shifted fourth value based on the logarithm of the minimum bit length of the codeword; obtaining additional bits from the compressed bitstream based on the determined number of bits; obtaining a shifted state value by left shifting the initial state value based on the determined number of bits; and obtaining the current state value by adding the shifted state value and the additional bits.

The at least one processor may include a plurality of processors, wherein the decoding function is applied in parallel by the plurality of processors for the plurality of symbols, wherein, to perform the decoding function, each processor of the plurality of processors may be assigned a corresponding initial state value, wherein after each processor determines the number of bits to be transferred into the corresponding initial state value, each processor may be assigned a corresponding memory location from which to obtain the additional bits, and wherein after the additional bits are obtained from the compressed bitstream, the method may further include determining a corresponding current state value for each processor.

BRIEF DESCRIPTION OF DRAWINGS

These and/or other aspects will become apparent and more readily appreciated from the following description, taken in conjunction with the accompanying drawings in which:

FIG. 4A is a diagram illustrating an example of a frequency table, in accordance with some embodiments;

FIG. 4B is a diagram illustrating an example of a forest of single trees, in accordance with some embodiments;

FIG. 4D is a diagram illustrating an example of a table including information about a Huffman tree, in accordance with some embodiments;

FIG. 5 is a diagram illustrating an example of an algorithm for determining a most significant set bit, in accordance with some embodiments;

FIG. 8C is a diagram illustrating an example of an algorithm for determining a number of bits to be transferred out of a state value, in accordance with some embodiments;

FIG. 9C is a diagram illustrating an example of an algorithm for determining a number of bits to be transferred into a state value, in accordance with some embodiments;

DETAILED DESCRIPTION

Figure 1:
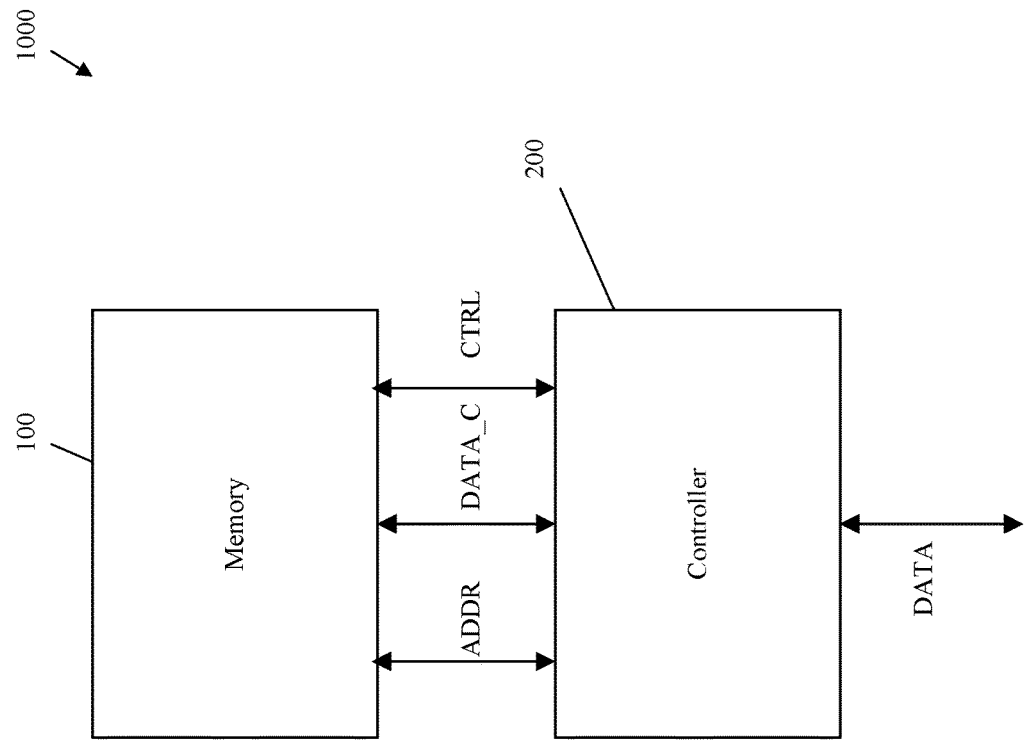
FIG. 1 is a block diagram schematically illustrating an example of a memory system, in accordance with some embodiments.

Hereinafter, example embodiments of the disclosure will be described in detail with reference to the accompanying drawings in which like reference numerals refer to like elements throughout. It is understood, however, that the disclosure is not limited to embodiments described herein, and that features and components from one embodiment may be included or omitted in another embodiment. For convenience, duplicative description of elements that are the same or similar may be omitted.

Further, it is understood that as used herein, expressions such as "at least one of," when preceding a list of elements, modify the entire list of elements and do not modify the individual elements of the list. For example, the expressions "at least one of [A], [B], and [C]" or "at least one of [A], [B], or [C]" means only A, only B, only C, A and B, B and C, A and C, or A, B, and C.

It is also understood that, although the terms "first," "second," etc., may be used herein to describe various elements, these elements should not be limited by these terms (e.g., should not be interpreted as designating a relative order or significance). These terms are only used to distinguish one element from another.

Additionally, as used herein, the singular forms "a," "an" and "the" are intended to include the plural forms as well, unless otherwise indicated explicitly or by the surrounding context.

The following description is presented to enable one of ordinary skill in the art to make and use the disclosure and to incorporate it in the context of particular applications. While the foregoing is directed to specific examples, other and further examples may be devised without departing from the basic scope thereof.

Various modifications, as well as a variety of uses in different applications will be readily apparent to those skilled in the art, and the general principles defined herein may be applied to a wide range of embodiments. Thus, the disclosure is not intended to be limited to the embodiments presented, but is to be accorded the widest scope consistent with the principles and novel features disclosed herein.

In the description provided, numerous specific details are set forth in order to provide a more thorough understanding of the disclosure. However, it will be apparent to one skilled in the art that the disclosure may be practiced without necessarily being limited to these specific details. In other instances, well-known structures and devices are shown in block diagram form, rather than in detail, in order to avoid obscuring the disclosure.

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Various features are described hereinafter with reference to the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6 or 35 U.S.C. 112(f).

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Moreover, the terms "system," "component," "module," "interface," "model," or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Unless explicitly stated otherwise, each numerical value and range can be interpreted as being approximate as if the word "about" or "approximately" preceded the value of the value or range. Signals and corresponding nodes or ports might be referred to by the same name and are interchangeable for purposes here.

While embodiments have been described with respect to circuit functions, the embodiments of the disclosure are not limited. Possible implementations, may be embodied in a single integrated circuit, a multi-chip module, a single card, system-on-a-chip, or a multi-card circuit pack. As would be apparent to one skilled in the art, the various embodiments might also be implemented as part of a larger system. Such embodiments might be employed in conjunction with, for example, a digital signal processor, microcontroller, field-programmable gate array, application-specific integrated circuit, or general-purpose computer.

As would be apparent to one skilled in the art, various functions of circuit elements might also be implemented as processing blocks in a software program. Such software might be employed in, for example, a digital signal processor, microcontroller, or general-purpose computer. Such software might be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the disclosure. When implemented on a general-purpose processor, the program code segments combine with the processor to provide a unique device that operates analogously to specific logic circuits. Described embodiments might also be manifest in the form of a bit stream or other sequence of signal values electrically or optically transmitted through a medium, stored magnetic-field variations in a magnetic recording medium, etc. generated using a method and/or an apparatus as described herein.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

FIG. 1 is a block diagram schematically illustrating a memory system 1000, in accordance with some embodiments. Referring to FIG. 1, a memory system 1000 may include a memory 100 and a controller 200.

The memory 100 may be configured to perform write, read, and erase operations according to a control of the controller 200. In embodiments, the memory 100 may be, for example, a nonvolatile memory or a volatile memory.

The controller 200 may be connected to a host (not shown) and the memory 100. The controller 200 may access the memory 100 in response to a request from the host. For example, the controller 200 may be configured to control write, read, and erase operations of the memory 100. The controller 200 may be configured to provide an interface between the memory 100 and the host. The controller 200 may be configured to drive firmware for controlling the memory 100.

The controller 200 may receive input data from the host. The controller 200 may encode the input data, for example DATA as shown in FIG. 1, to generate coded data DATA_C. The controller 200 may be configured to provide a control signal CTRL and an address ADDR to the memory 100. The controller 200 may be configured to exchange the coded data DATA_C with the memory 100. The controller 200 may receive the coded data DATA_C from the memory 100 to decode the coded data DATA_C. The controller 200 may transfer the decoded data, for example DATA as shown in FIG. 1, to the host.

In embodiments, the memory system 1000 may include or be implemented as a solid state drive (SSD) including form factors such as memory card form factors including Secure Digital and variations thereof, and etc., as standard hard disk drive (HDD) form factors, standard card form factors, including mini-Serial AT Attachment (mSATA), PCI Express Mini Card, M.2, etc., disk-on-a-module form factors with interfaces such as Parallel ATA (PATA) or SATA, box form factors for applications such as rack-mount systems, bare-board form factors including PCI Express (PCIe), mini PCIe, mini-dual in-line memory module (DIMM), MO-297, etc., and ball grid array form factors.

The memory 100 may include, but is not limited to, a flash memory device, a NAND flash memory device, a phase change RAM (PRAM), a ferroelectric RAM (FRAM), a magnetic RAM (MRAM), etc. The memory 100 may have a planar structure or a three-dimensional (3D) memory cell structure with a stack of memory cells. Each of the memory cells may include levels to store respective bits of data. The memory 100 may be implemented, for example, as a memory chip (e.g., a NAND chip). Though, for the purpose of simplicity, only one memory 100 is illustrated in FIG. 1, the memory system 1000 may include several memory devices (e.g., memory chips) arranged in multiple ways and connected to the controller 200 via multiple channels.

Figure 2A:
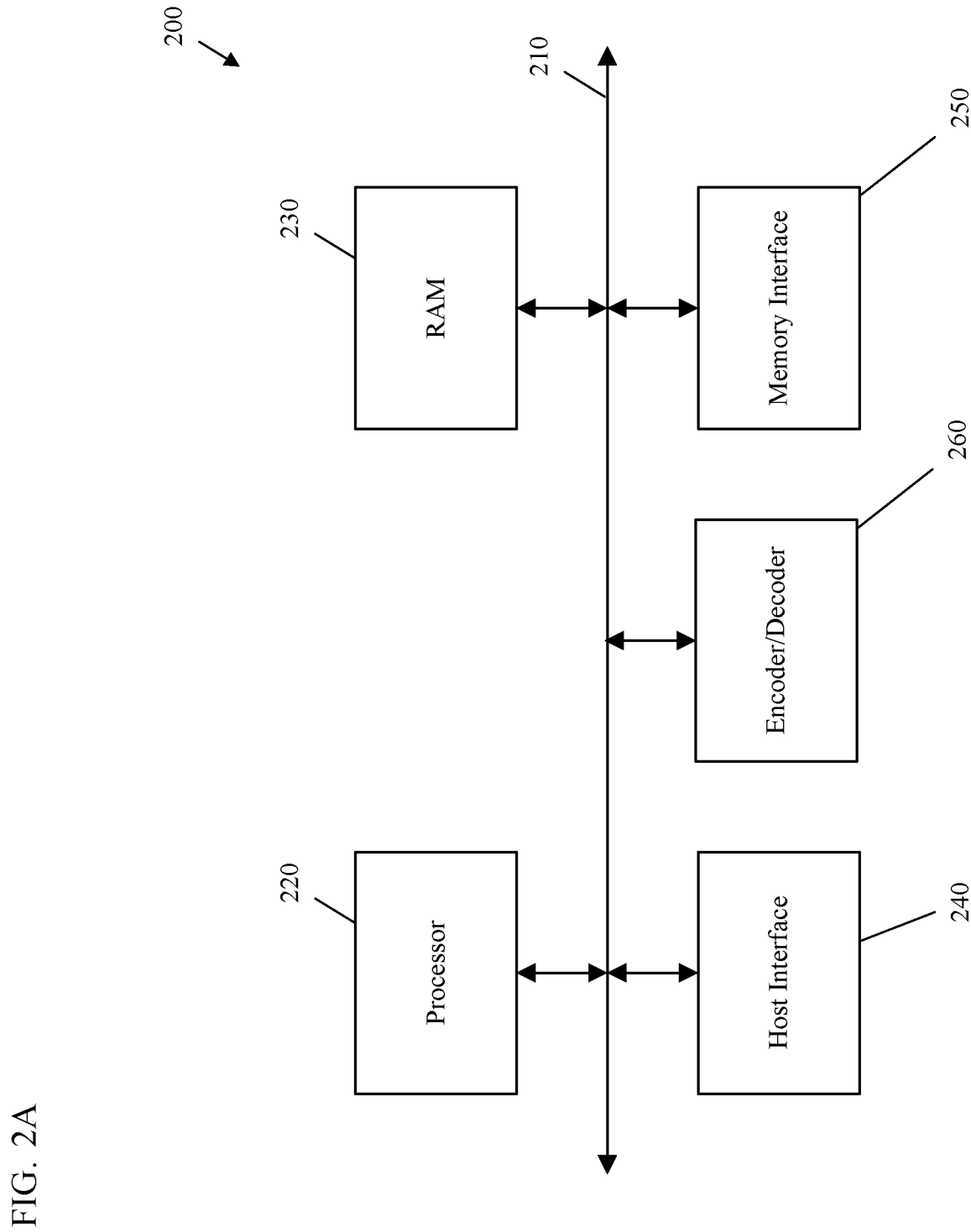
FIG. 2A is a block diagram schematically illustrating a controller, in accordance with some embodiments.

FIG. 2A is a block diagram schematically illustrating a controller, in accordance with some embodiments. Referring to FIG. 2A, a controller 200 may include a system bus 210, a processor 220, a RAM 230, a host interface 240, a memory interface 250, and an encoder/decoder 260. The controller shown in FIG. 2A may be or may correspond to the controller 200 shown in FIG. 1.

The system bus 210 may provide a channel among the components 220 to 260 of the controller 200. The processor 220 may control an overall operation of the controller 200. The RAM 230 may be used as at least one of a working memory, a cache memory, and a buffer memory. The host interface 240 may communicate with an external device (e.g., a host) via at least one of various communications standards such as USB (Universal Serial Bus), MMC (multimedia card), PCI (peripheral component interconnection), PCI-E (PCI-express), ATA (Advanced Technology Attachment), Serial-ATA, Parallel-ATA, SCSI (small computer small interface), ESDI (enhanced small disk interface), IDE (Integrated Drive Electronics), and a Firewire.

The memory interface 250 may interface with a memory device, for example the memory 100 as shown in FIG. 1. The memory interface 250 may include a NAND circuit interface or a NOR circuit interface.

The encoder/decoder 260 may perform encoding on data received from an external host and decoding on data received from the memory 100. For example, the encoder/decoder 260 may code input data, received, for example, as DATA shown in FIG. 1, to generate coded data DATA_C. In addition, the encoder/decoder 260 may receive coded DATA_C, and decode the coded DATA_C to reconstruct or recover data, and output the reconstructed or recovered data as DATA as shown in FIG. 1.

Figure 2B:
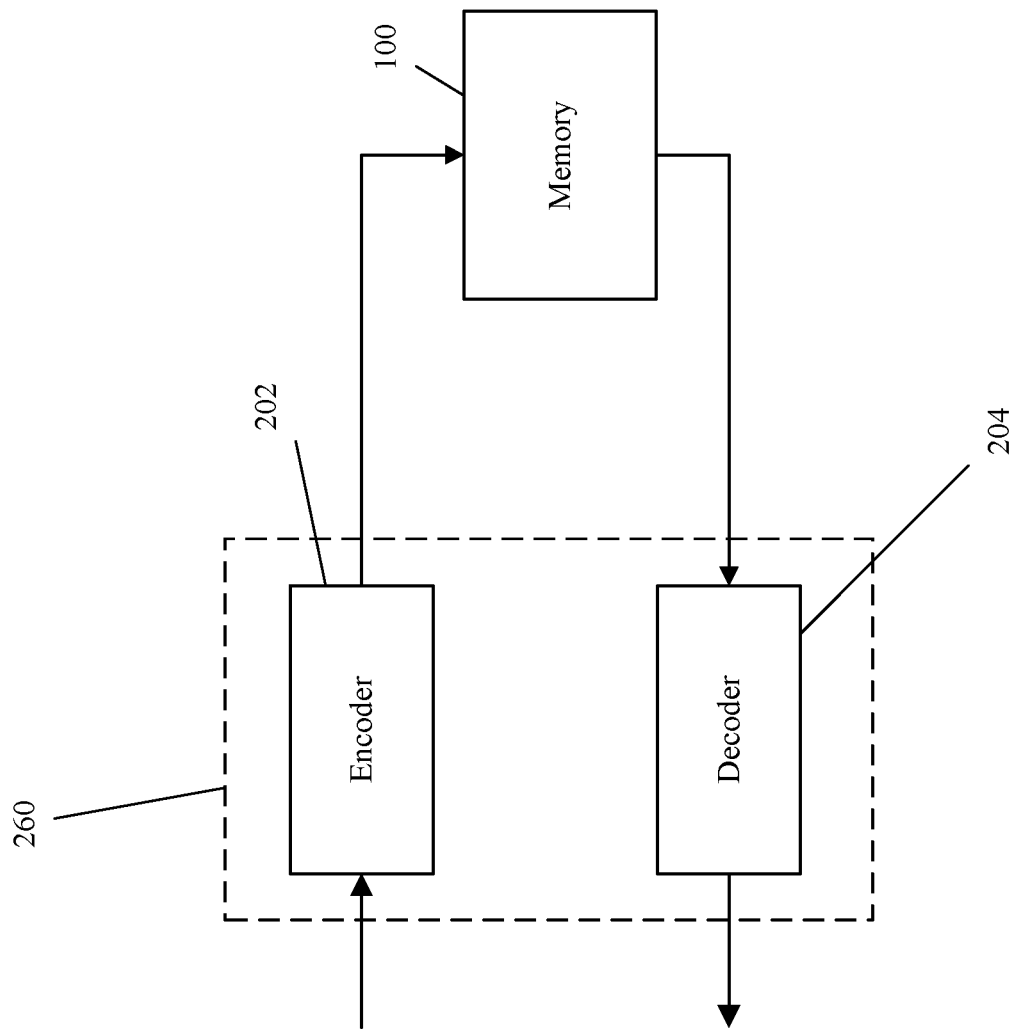
FIG. 2B is a block diagram schematically illustrating an example of an encoder/decoder 260, in accordance with some embodiments.

FIG. 2B is a block diagram schematically illustrating an example of an encoder/decoder 260, in accordance with some embodiments. Referring to FIGS. 2A and 2B, the encoder/decoder 260 may include one or both of an encoder 202 and a decoder 204.

The encoder 202 may receive a plurality of information word bits. In embodiments, the information word bits may be included in a symbol stream which may include a plurality of symbols. The symbol stream and/or the information word bits may be received, for example, from a host. The encoder 202 may perform encoding on the symbol stream and/or the information word bits to generate coded values. In embodiments, the coded values may be, for example a coded or compressed bitstream, which may include a plurality of prefix codes. The coded values may be programmed at a memory 100. Data programmed at the memory 100 may be read as coded values. The decoder 204 may perform decoding on the read coded values to generate information word bits and/or a symbol stream, for example by reconstructing or recovering the information word bits and/or the symbol stream received from the host.

In embodiments, the encoder 202 may be referred to as a compressor, the decoder 204 may be referred to as a decompressor, and the encoder/decoder 260 may be referred to as a compressor/decompressor. For example, the encoder 202 may compress a symbol stream into a compressed bitstream, and the decoder 204 may decompress the compressed bitstream to reconstruct or otherwise generate the symbol stream.

Figure 3:
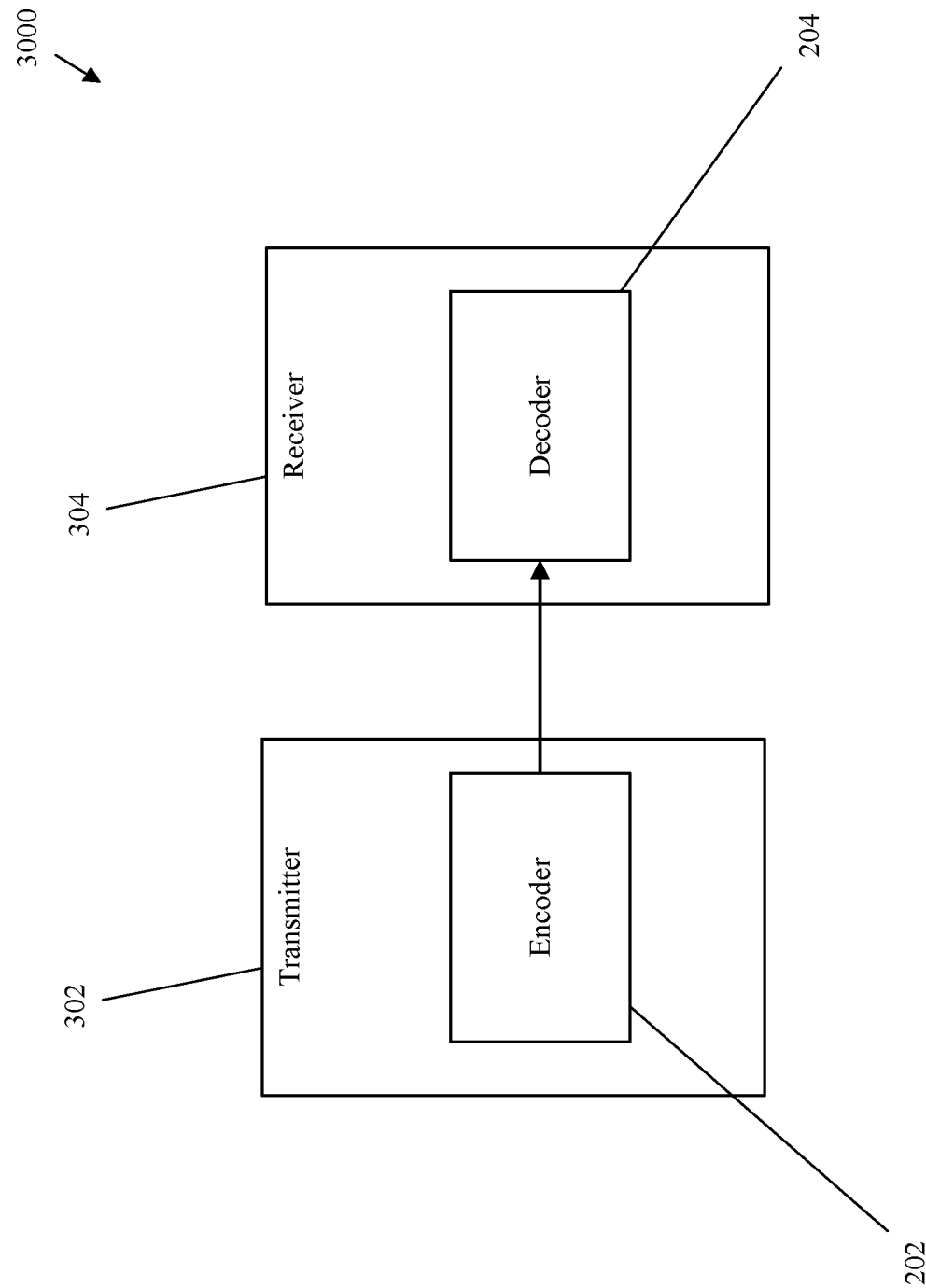
FIG. 3 is a block diagram schematically illustrating an example of a communication system, in accordance with some embodiments.

In embodiments, one or more of the encoder 202 and the decoder 204 may be included in systems or devices other than the memory system 1000. For example, FIG. 3 is a block diagram schematically illustrating an example of communication system 3000 according to embodiments. As can be seen in FIG. 3, the communication system 3000 may include a transmitter 302, which may communicate with a receiver 304, for example over a wired or wireless communication channel. In embodiments, the transmitter 302 may include the encoder 202 shown in FIG. 2B, and may use the encoder 202 to generate a compressed bitstream based on a symbol stream. The transmitter 302 may transmit the compressed bitstream generated by the encoder 202 to the receiver 304 using the wired or wireless communication channel. In embodiments, the receiver 304 may include the decoder 204 shown in FIG. 2B, which may decompress the compressed bitstream to reconstruct the symbol stream.

In embodiments, one or more of the encoder 202 and the decoder 204 may use entropy coding techniques. For example, in embodiments, the encoder 202 and the decoder 204 may use one or more of an arithmetic coding technique and a range coding technique. These techniques may allow compression that is close to the Shannon limit. However, these techniques are generally complex, and may make use of several multiplication operations by the encoder 202, and several division operations by the decoder 204.

As another example, in embodiments, the encoder 202 and the decoder 204 may use range asymmetric numeral systems (rANS) coding techniques. The rANS coding techniques may also allow compression that is close to the Shannon limit. However, these techniques are also somewhat complex, and may make use of one division operation by the encoder 202, and one multiplication operation by the decoder 204. The rANS coding techniques may involve stack encoding/decoding, which may refer to last-in-first out (LIFO) operations. In addition, the rANS coding techniques may allow native parallel encoding and decoding.

As another example, in embodiments, the encoder 202 and the decoder 204 may use table asymmetric numeral systems (tANS) coding techniques. The tANS coding techniques may also allow compression that is close to the Shannon limit. In addition, the tANS coding techniques may be less complex than the techniques discussed above, and may make use of shift, add, and table lookup operations by the encoder 202 and the decoder 204. However, the tANS coding techniques may make use of a relatively large memory footprint, and may use an additional step to create a table. The tANS coding techniques may involve stack encoding/decoding, and may allow native parallel encoding and decoding.

As yet another example, in embodiments, the encoder 202 and the decoder 204 may use Huffman coding techniques. The Huffman coding techniques may be optimal to the Shannon limit within 1 bit per symbol. In addition, the Huffman coding techniques may be less complex than some of the techniques described above, and may make use of shift and table lookup operations by the encoder 202 and the decoder 204. However, the Huffman coding techniques may be difficult to parallelize, especially in the decoder 204.

Below are provided more detailed examples of several of the techniques discussed above. In embodiments, several of the techniques discussed above, for example, the arithmetic coding techniques, the range coding techniques, the tANS coding techniques, and the Huffman coding techniques, may use a static frequency table. The frequency table may be created by scanning the symbol stream to be encoded. Then the frequency table may typically be compressed by the encoder 202 and sent as a prefix message to the bitstream. The decoder 204 can then decompress and recreate the frequency table before decoding the bitstream.

Figure 4A:
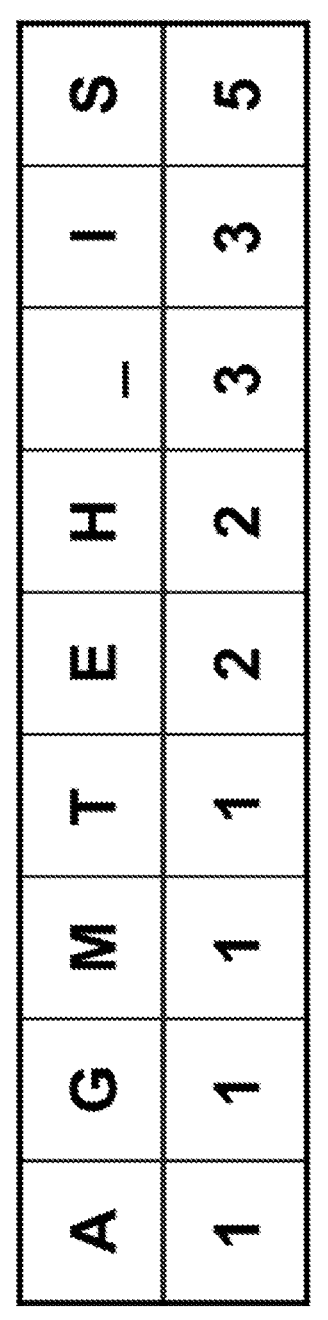

FIG. 4A is a diagram illustrating an example of a frequency table for an example message of "THIS IS HIS MESSAGE", in accordance with some embodiments. As can be seen in FIG. 4A, each symbol included in the example message may be listed in the frequency table, along with information about a number of occurrences of the symbol within the example message. For example, as shown in FIG. 4A, the frequency table may indicate that a symbol "S" occurs 5 times in the example message, may indicate that a symbol "I" occurs 3 times in the example message, and so on.

In order to perform encoding according to an example Huffman coding technique, after the frequency table is constructed, a Huffman tree corresponding to the example message may be obtained. The process of constructing the Huffman tree may begin by placing the symbols into a sorted forest of single node trees.

Figure 4B:
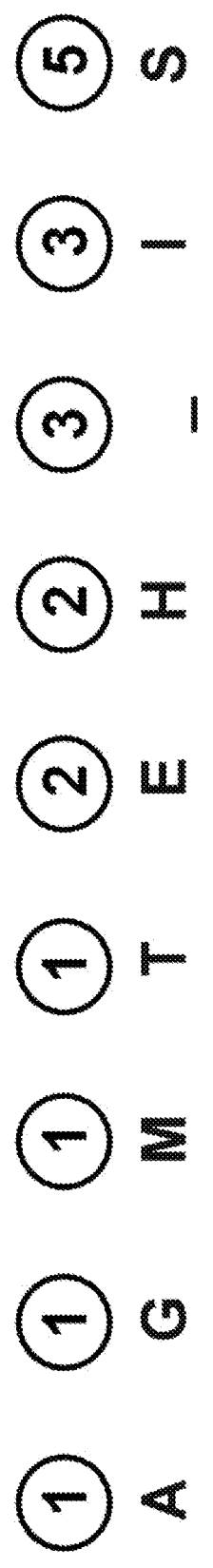

FIG. 4B is a diagram illustrating an example of a forest of single node trees for the example message "THIS IS HIS MESSAGE", in accordance with some embodiments. As can be seen in FIG. 4B, each single node tree includes a symbol and the corresponding frequency.

Next, a recursive operation may be performed, including selecting two trees having a smallest frequency at the root, producing a new binary tree with the selected trees as children, and storing the sum of their frequencies in the root.

Figure 4C:
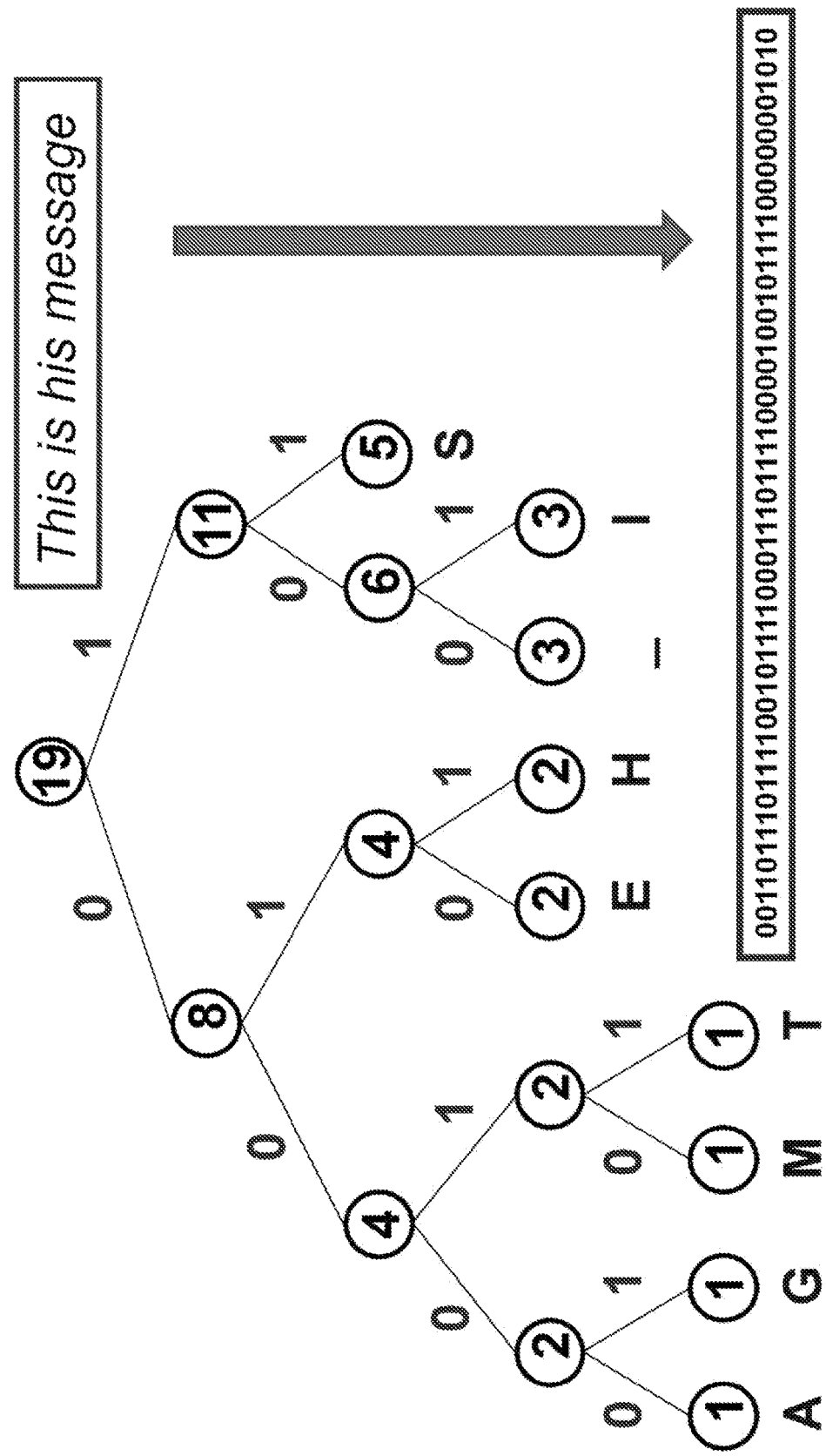
FIG. 4C is a diagram illustrating an example of a Huffman tree, in accordance with some embodiments.

The recursion may end when there is one tree. This final tree may be referred to as a Huffman tree, a Huffman coding tree, or an optimal Huffman tree. FIG. 4C is a diagram illustrating an example of a Huffman tree for the example message "THIS IS HIS MESSAGE", in accordance with some embodiments.

An important aspect of a Huffman tree may relate to a resulting log frequency table derived from the lengths, for example the bit lengths, of prefix codes which may be used to represent the symbols. As used herein, "s" may represent a symbol, "S" may represent a number of the symbols in a range of 0 to S−1, "$l_s$" may represent a length of the Huffman tree for each symbol, which may also correspond to a length of a prefix code used to represent each symbol, "n" may represent a maximum value for $l_s$ in the symbols S, "p(s)" may represent a probability of each symbol, "$F_s$" may represent a frequency count for each symbol, "N" may represent a sum of the frequency counts, and "$z_s$" may represent a logarithm of the frequency count for each symbol. In embodiments, the logarithm of the frequency count may be referred to as a log frequency count, and may for example be equal to $\log_2 F_s$. As used herein, unless otherwise specified, the logarithm may refer to the binary logarithm, or the logarithm to the base 2.

Because each decision in the Huffman tree is binary, Equation 1 below may hold:

$$p(s) = \frac{1}{2^{l_s}} \qquad \text{Equation 1}$$

In addition, it may be known that Equation 2 holds:

$$\Sigma_s p(s)=1 \qquad \text{Equation 2}$$

Therefore, Equations 3-5 may also hold:

$$\sum_S \frac{1}{2^{l_s}} = 1 \qquad \text{Equation 3}$$

$$\sum_S \frac{2^n}{2^{l_s}} = 2^n \qquad \text{Equation 4}$$

$$\sum_S 2^{n-l_s} = 1 \qquad \text{Equation 5}$$

Because $F_s \geq 1$, and $2^{n-l_s} \geq 1$, Equations 6-7 may hold:

$$F_s = 2^{n-l_s} \qquad \text{Equation 6}$$

$$N = 2^n \qquad \text{Equation 7}$$

Therefore, Equation 8 may hold:

$$z_s = n - l_s \qquad \text{Equation 8}$$

Therefore, it can be seen that for each symbol, a logarithm of the frequency count for each symbol may be equal to a length of the Huffman tree for each symbol subtracted from the maximum length of the Huffman tree. Expressed differently, the log frequency count for each symbol may be equal to a difference between a maximum length of a prefix code, and a length of the prefix code corresponding to each symbol.

FIG. 4D is a diagram illustrating an example of a table including information about a Huffman tree corresponding to the example message "THIS IS HIS MESSAGE", in accordance with some embodiments. The table of FIG. 4D lists each symbol, along with the corresponding length of the Huffman tree for each symbol, the bitstream (or prefix code) used to represent each symbol, the frequency count for each symbol, and the log frequency count for each symbol.

In order to perform encoding according to an example rANS coding technique, an encoding function according to an example rANS coding technique may be expressed as Equation 9 below:

$$C(s,x) = N \lfloor x/F_s \rfloor + (x \bmod F_s) + B_s \qquad \text{Equation 9}$$

In Equation 8 above, C may represent the encoding function, x may be a positive integer representing a state of the encoder 202 or the decoder 204, and $B_s$ may represent a cumulative frequency count corresponding to a symbol s, and N may represent a total frequency count. In embodiments, the element x may be referred to as a state value. The element $B_s$ may satisfy Equations 10-12 below:

$$B_0 = 0 \qquad \text{Equation 10}$$

$$B_s = B_{s-1} + F_{s-1} \qquad \text{Equation 11}$$

$$B_s = N \qquad \text{Equation 12}$$

In order to perform decoding according to an example rANS coding technique, a symbol s may be found which satisfies Equation 13 below:

$$B_s \leq x \bmod N \leq B_{s+1} \qquad \text{Equation 13}$$

Then, a decoding function D(x) may be applied to a current state x according to Equation 14 below:

$$D(x) = F_s \lfloor x/N \rfloor + (x \bmod N) - B_s \qquad \text{Equation 14}$$

In order to perform encoding on a streaming bitstream σ according to an example streaming rANS encoding technique, an output block of size B may be defined, and a value b may be defined such that B is equal to $2^b$. Then, while a state value x is greater than or equal to $2^b F_s$, an updated bitstream σ' and an updated state value x' may be obtained by applying Equations 15-16 below:

$$\sigma' = \sigma 2^b + (x \bmod 2^b) \qquad \text{Equation 15}$$

$$x' = \lfloor x/2^b \rfloor \qquad \text{Equation 16}$$

Then, the encoding function of Equation 9 may be applied to the updated state value x'.

In order to perform decoding according to the example streaming rANS coding technique, a symbol s may be found which satisfies Equation 17 below:

$$B_s \leq x \bmod N \leq B_{s+1} \qquad \text{Equation 17}$$

Then, the encoding function of Equation 9 may be applied to the updated state value x'.

Then, the decoding function D(x) of Equation 14 may be applied to an updated state value x', and while the state value x is less than N, equations 18-19 below may be applied:

$$x' = x 2^b + (\sigma \bmod 2^b) \qquad \text{Equation 18}$$

$$\sigma' = \lfloor \sigma/2^b \rfloor \qquad \text{Equation 19}$$

The example streaming rANS coding technique may have the property that the encoder and decoder states are exactly synchronized, unlike for example the range coding technique discussed above. In addition, when decoding the symbol may be known immediately. As a result, the example rANS coding technique may automatically set the number of bits to be read. This is the opposite of Huffman coding, in which the current bit sequence must be read in order to find the symbol and start of the next bit sequence. This means that streams in rANS may be interleaved even when decoding without metadata.

Another example coding technique is a parallel rANS coding technique. In the example parallel rANS coding technique, individual encoders and decoders can be run in parallel, with a blocking coordination step of O(log p). Each processor, for example each individual encoder or decoder, may exchange the size of the block and can therefore write or read the data in parallel.

Each of the coding techniques discussed above may have certain benefits and certain drawbacks. For example, none of the coding techniques discussed above exhibit a combination of all of the attributes of a low memory space requirement, low complexity, high throughput (for example by being easily parallelizable), and near optimum compression.

Therefore, a coding technique in accordance with some embodiments may be constructed in such a way as to take advantage of the benefits of several of the coding techniques above, without exhibiting the same drawbacks. For example, a coding technique according to some embodiments may combine certain elements of the near optimum low complexity Huffman coding technique with the native parallel implementation of rANS coding techniques. In embodiments, this coding technique may be referred to as a Huffman asymmetric numeral systems (hANS) coding technique.

In embodiments, the hANS coding technique may use a Huffman coding tree to create a frequency table, which may achieve near optimal entropy encoding and decoding. In addition, the hANS coding technique may involve sending a table which may have a lower cost to send than the static frequency table, that is sent for example using the rANS coding technique. In addition, the hANS coding technique may have a complexity that is similar to the tANS coding technique. In addition, similar to the rANS coding technique, the hANS coding technique may not require precomputed tables as is the case for the tANS coding technique. In addition, the hANS coding technique may involve embedding a symbol length in an output bitstream, which may allow the hANS coding technique to be easily parallelized.

Therefore, embodiments relating to the hANS coding technique, for example according to FIGS. 5-13C discussed below, may have a low memory space requirement, low complexity, high throughput (for example by being easily parallelizable), and near optimum compression.

FIGS. 5-13C relate to example processes for encoding and decoding data according to the hANS coding technique, and example devices configured to perform such processes. For example, FIGS. 6A-6B relate to a basic hANS encoder, and FIGS. 7A-7B relate to a basic hANS decoder. Similarly, FIGS. 8A-8C relate to a streaming hANS encoder, and FIGS. 9A-9C relate to a streaming hANS decoder. In addition, FIG. 10 relates to a parallel hANS encoder, and FIG. 11 relates to a parallel hANS decoder. FIGS. 12A-12C and FIGS. 13A-13C relate to example processes for encoding and decoding data using the hANS coding technique. In at least some embodiments, the elements illustrated in FIGS. 5-13C may be included in, for example, memory system 1000 or communication system 3000 discussed above.

In the below description, a notation may be used which resembles the syntax of the C programming language. In accordance with this notation, the symbol "<<" may indicate an unsigned integer shifted left. For example, the expression "x<<i" may indicate an integer "x" shifted left by "i", and the expression "1<<i" may be equal to the expression "$2^i$". In addition, the symbol ">>" may indicate an unsigned integer shifted right. For example, the expression "x>>i" may indicate an integer "x" shifted right by "i", and may be equal to the expression "$\lfloor x/2^i \rfloor$". Further, the symbol "&" may indicate an unsigned integer bitwise AND operation, the symbol "+" may indicate an integer addition operation, and the symbol "−" may indicate an integer subtraction operation. In embodiments, the element "$F_s$" may refer to a frequency count corresponding to a symbol "s", the element "z[s]" may refer to log frequency count corresponding to a symbol "s" from a log frequency array "z", such that z[s]=1<<$F_s$, the element "B[s]" may refer to a cumulative frequency count corresponding to the symbol "s" from a cumulate frequency array "B", and the element "n" may refer to a logarithm of a sum of the log frequency array, such that 1<<n=N.

In embodiments, the hANS coding technique may involve the determination or computation of a most significant set bit. In embodiments, the most significant set bit of x may be expressed as $\lfloor \log_2 x \rfloor$. FIG. 5 is a diagram illustrating an example of an algorithm for determining a most significant set bit, in accordance with some embodiments. As can be seen in FIG. 5, a most significant set bit of an integer v may be represented as mssb, and may be calculated using only bitwise shift operations and bitwise OR operations.

In embodiments, the hANS coding technique may involve a function for writing bits to a bitstream, which may be referred to as a writebits function. In embodiments, the writebits function may be defined as follows:

> void writebits(unsigned int*ptr,unsigned int src,unsigned int bits);

In embodiments, writebits may be a bit oriented function which works as follows: At a given point in the bitstream (indicated by the integer value of the *ptr), add the least significant bit (LSB) bits off src, and increment the *ptr+=bits. For example if *ptr=17, src=0101, bits=4, then added to the tail of the bitstream would be 0101, and the ptr would be incremented to 21.

In embodiments, the hANS coding technique may involve a function for reading bits from a bitstream, which may be referred to as a readbits function. In embodiments, the readbits function may be defined as follows:

> unsigned int readbits(unsigned int*ptr,unsigned int bits);

In embodiments, readbits may be a bit oriented function which operates as follows: At a given point in the bitstream (indicated by the integer value of the *ptr) remove the LSB bits of the bitstream, return that value, and decrement the *ptr−=bits. For the above example with *ptr=21, bits=4, then 0101 would be returned and *ptr=17

For convenience of description, examples of the hANS coding technique according to embodiments are presented below in an order of a basic hANS coding technique, a streaming hANS coding technique, and a parallel hANS coding technique. Each of these techniques may be understood as building on the previous technique.

Figure 6A:
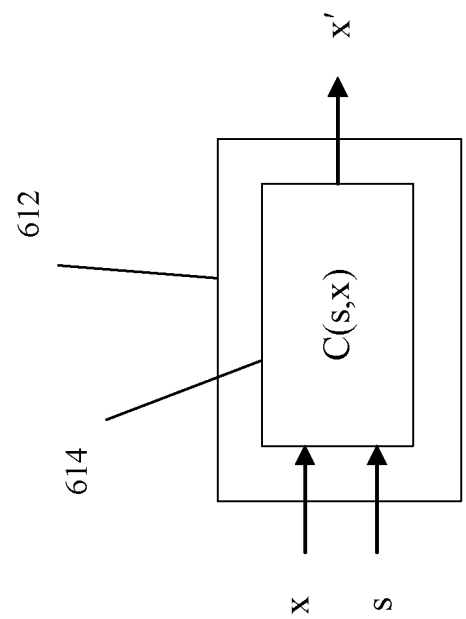
FIG. 6A is a block diagram schematically illustrating an example of an encoder, in accordance with some embodiments.

As discussed above, FIG. 6A is a block diagram schematically illustrating an example of an encoder 612, which may be referred to as a basic hANS encoder, in accordance with some embodiments. As can be seen in FIG. 6A, the encoder 612 may receive a symbol s and a current state value x, and may apply an encoding function 614 in order to output an updated state value x'. An example of the encoding function 614 which may be used for hANS coding is provided below.

Figure 6B:
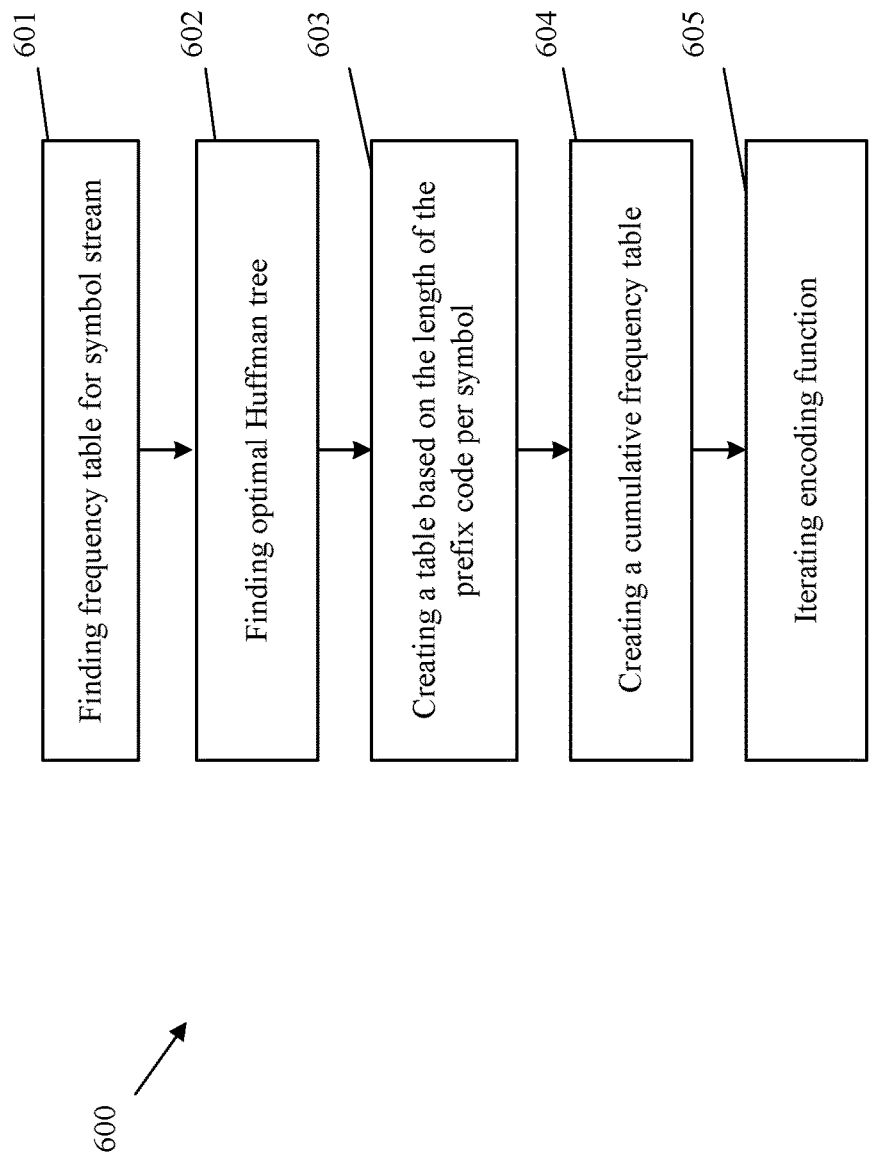
FIG. 6B is a flowchart of a process for encoding a symbol stream to generate a compressed bitstream, in accordance with some embodiments.

FIG. 6B is a flow chart of process 600 for encoding a symbol stream to generate a compressed bitstream, in accordance with some embodiments. In some implementations, one or more process blocks of FIG. 6B may be performed by one or more of the elements discussed above, for example one or more of the encoder 612 and the elements included therein.

As shown in FIG. 6B, process 600 may include finding a frequency table for the symbol stream (operation 601). For example, given a symbol stream with S symbols in the alphabet, where the symbol stream has a length of M, the frequency table may indicate the number of times that a particular symbol s appears within the symbol stream.

As further shown in FIG. 6B, process 600 may include finding an optimal Huffman tree (operation 602). In embodiments, the optimal Huffman tree may be found based on the frequency table. In embodiments, each symbol s of the symbol stream may be assigned a prefix code such that the system, for example the encoder 612 or a storage system including the encoder 612, such as the memory system 1000 or the communication system 3000, achieves the Shannon limit within one bit per symbol. In embodiments, operation 602 may correspond to a step from a Huffman encoding technique. However, embodiments, process 600 may not involve sending a table such as a frequency table or prefix code tree to a decoder. Instead, in embodiments a table which indicates only the length of the prefix code for each symbol s may be sent in process 600. In embodiments, a logarithm frequency table, which may indicate a logarithm of a frequency count for each symbol, may be sent in process 600.

As further shown in FIG. 6B, process 600 may include creating a table based on the length of the prefix code for each symbol s, which may be represented as l[s], along with n (operation 603). In embodiments, this table may be referred to as a prefix length table. In embodiments, the element z[s], which may represent the logarithm of the frequency of s, may be equal to n−l[s]. In embodiments, 1<<z[s] may be the frequency count corresponding to the symbol s, and a sum of the frequency counts for the symbol stream may be equal to 1<<n.

As further shown in FIG. 6B, process 600 may include creating a cumulative frequency table (operation 604). In embodiments, the cumulative frequency table may be created based on one or more of the tables created in operations 602 and 603. In embodiments, the cumulative frequency count corresponding to a symbol s may be represented as B[s]. In embodiments, Equations 20-22 below may hold for the cumulative frequency table:

$$B[0]=0 \qquad \text{Equation 20}$$

$$B[s]=B[s-1]+(1<<z[s-1]) \qquad \text{Equation 21}$$

$$B[S]=1<<n \qquad \text{Equation 22}$$

As further shown in FIG. 6B, process 600 may include iterating an encoding function 614 for M symbols (operation 605). In embodiments, the encoding function 614 may be expressed as Equation 23 below:

$$C(s,x)=((x>>z[s])<<n)+(x\&((1<<z[s])-1))+B[s] \qquad \text{Equation 23}$$

In embodiments, a result of applying the encoding function 614 to a symbol s and a current state value x may be an updated state value x'. In embodiments, the updated state value x' may be used as a current state value for a next symbol. In embodiments, after operation 605 is iterated for all of the M symbols, the final updated state value x' may be the compressed bitstream corresponding to the input symbol stream. In embodiments, operation 605 may correspond to a low-complexity version of a step from a rANS encoding technique.

As can be seen above, the encoder 612 may generate a compressed bitstream based on an input symbol stream using only table lookup operations, bitwise shift operations, bitwise AND operations, and addition operations, according to process 600.

Figure 7A:
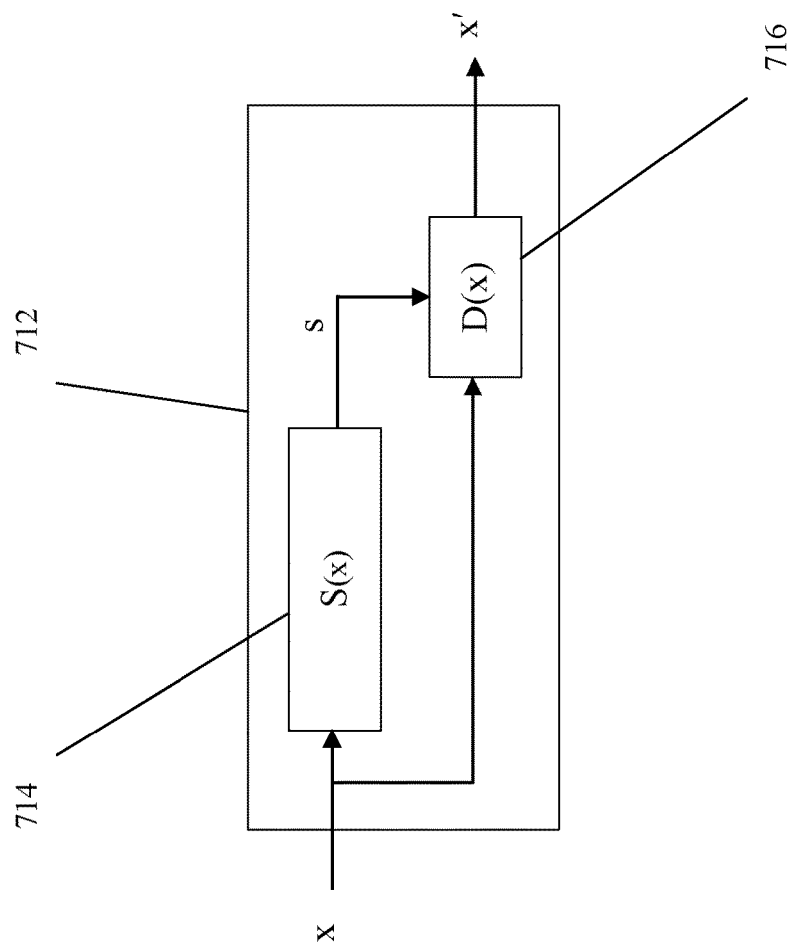
FIG. 7A is a block diagram schematically illustrating an example of a decoder, in accordance with some embodiments.

As discussed above, FIG. 7A is a block diagram schematically illustrating an example of a decoder 712, which may be referred to as a basic hANS decoder, in accordance with some embodiments. As can be seen in FIG. 7A, the decoder 712 may receive a current state value x, may obtain a corresponding symbol s from a symbol inverse table using table lookup function 714 based on the current state value x, and may apply a decoding function 716 in order to output an updated state value x'. An example of the decoding function 716 which may be used for hANS coding is provided below.

Figure 7B:
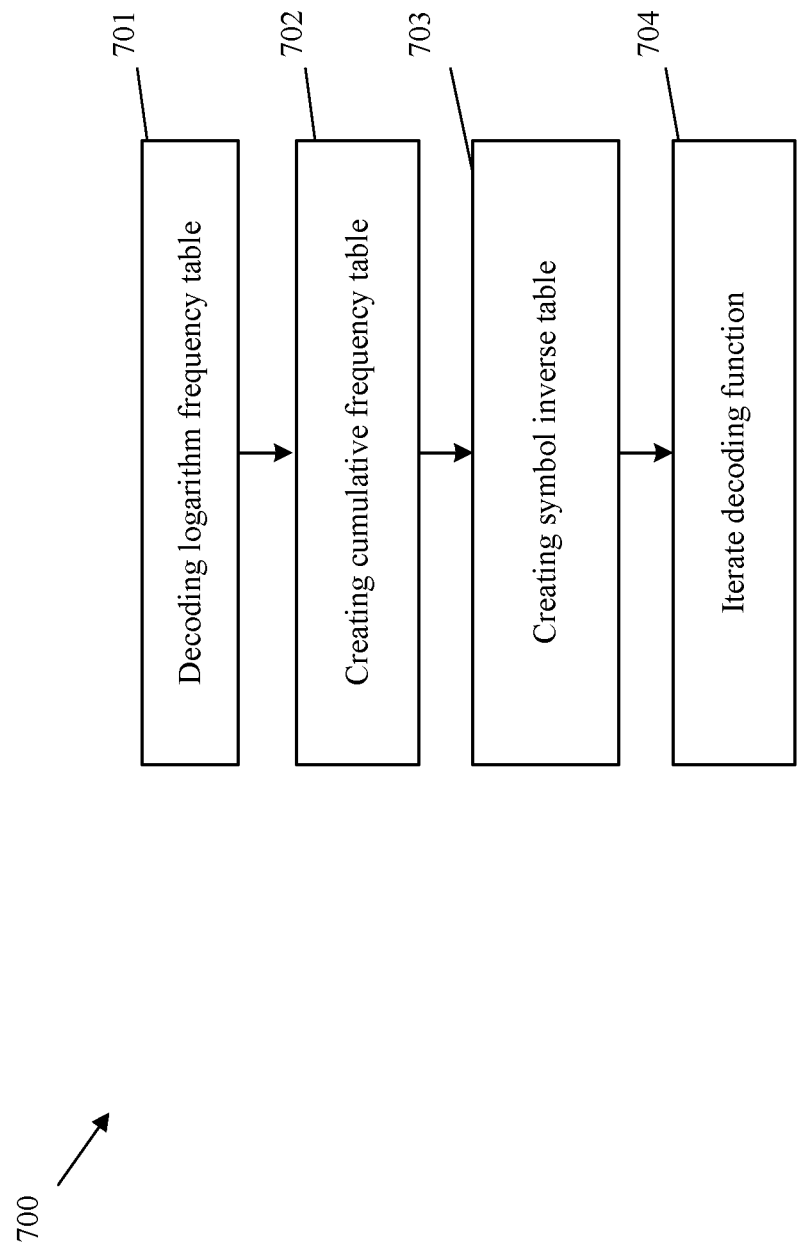
FIG. 7B is a flowchart of a process for decoding a compressed bitstream to generate a symbol stream, in accordance with some embodiments.

FIG. 7B is a flow chart of process 700 for decoding a compressed bitstream to generate a symbol stream, in accordance with some embodiments. In some implementations, one or more process blocks of FIG. 7B may be performed by one or more of the elements discussed above, for example one or more of the decoder 712 and the elements included therein.

As shown in FIG. 7B, process 700 may include decoding a logarithm frequency table (operation 701). In embodiments, the decoder 712 may receive a compressed bitstream and a table indicating prefix code lengths per symbol, for example the prefix length table of operation 603, and may decode the logarithm frequency table based on the compressed bitstream and the prefix code lengths.

As further shown in FIG. 7B, process 700 may include creating a cumulative frequency table (operation 702). In embodiments, the cumulative frequency table may be created by summing 1<<z[s].

As further shown in FIG. 7B, process 700 may include creating a symbol inverse table (operation 703). In embodiments, the symbol inverse table may correspond to the symbol inverse table used for the table lookup function 714. In embodiments, the symbol inverse table may be created by finding S[x&((1<<n)−1)] such that Equation 24 below holds:

$$B[s]<=x\&((1<<n)-1)<B[s+1] \qquad \text{Equation 24}$$

In embodiments, operation 703 may correspond to a step from one or more of an arithmetic coding technique, a range coding technique, a rANS coding technique, and a tANS coding technique.

As further shown in FIG. 7B, process 700 may include iterating a decoding operation for M symbols (operation 704). In embodiments, operation 704 may include determining a symbol s by performing a table lookup function 714, and determining an updated state value x' by applying a decoding function 716.

In embodiments, the table lookup function 714 may relate to retrieving a symbol s from the inverse symbol table, and may be performed according to Equation 25 below:

$$s=S[x\&((1<<n)-1)] \qquad \text{Equation 25}$$

In embodiments, the decoding function 716 may be expressed according to Equation 26 below:

$$D(x)=((x>>n)<<z[s])+(x\&((1<<n)-1))-B[s] \qquad \text{Equation 26}$$

In embodiments, a result of applying the decoding function 716 to a symbol s and a current state value x may be an updated state value x'. In embodiments, the updated state value x' may be used as a current state value for a next symbol. In embodiments, after operation 704 is iterated for all of the M symbols, the final updated state value x' may be the starting state of the encoder.

As can be seen above, the decoder 712 may recreate or otherwise generate a symbol stream based on compressed bitstream using only table lookup operations, bitwise shift operations, bitwise AND operations, and addition operations, according to process 700.

As discussed above, FIGS. 8A-8C and 9A-9C relate to a streaming hANS coding technique. In particular, FIGS. 8A-8C relate to a streaming hANS encoding technique, according to some embodiments. In embodiments, the streaming hANS encoding technique may include determining a value d, which may indicate a number of bits of the current state value x which are to be output to the compressed bitstream. In embodiments, the value d may be used to avoid branching, which may refer to the while loop as used in the streaming rANS coding technique discussed above. In embodiments, if branching is avoided, the speed of the coding process may be increased.

In embodiments, if n is an integer and x is a real value, then a relationship between the value n and the current state value x corresponding to a particular symbol s may be expressed according to Equation 27 below:

$$n \leq x < n+1 \leftrightarrow n = \lfloor x \rfloor \qquad \text{Equation 27}$$

If the n+1 restriction is removed, Equation 27 may be expressed as Equations 28 and 29 below:

$$\lfloor \log_2 x \rfloor \geq b + z[s] \qquad \text{Equation 28}$$

$$\lfloor \log_2 x \rfloor - z[s] \geq b \qquad \text{Equation 29}$$

Based on the above, Equations 30-36 below may be used to find the smallest value d such that d b-bit blocks are removed:

$$x' < 2^b F_s \qquad \text{Equation 30}$$

$$\lfloor x/2^{db} \rfloor < 2^b F_s \qquad \text{Equation 31}$$

$$\log_2 \lfloor x/2^{db} \rfloor < b + z[s] \qquad \text{Equation 32}$$

$$\log_2 \lfloor x \rfloor - db < b + z[s] \qquad \text{Equation 33}$$

Recalling Equation 27 above, it can be seen that Equations 34-36 below hold:

$$db > \lfloor \log_2 x \rfloor - b - z[s] \qquad \text{Equation 34}$$

$$d > \frac{\lfloor \log_2 x \rfloor - b - z[s]}{b} - 1 \qquad \text{Equation 35}$$

$$d = \left\lfloor \frac{\lfloor \log_2 x \rfloor - z[s]}{b} \right\rfloor \qquad \text{Equation 36}$$

Figure 8A:
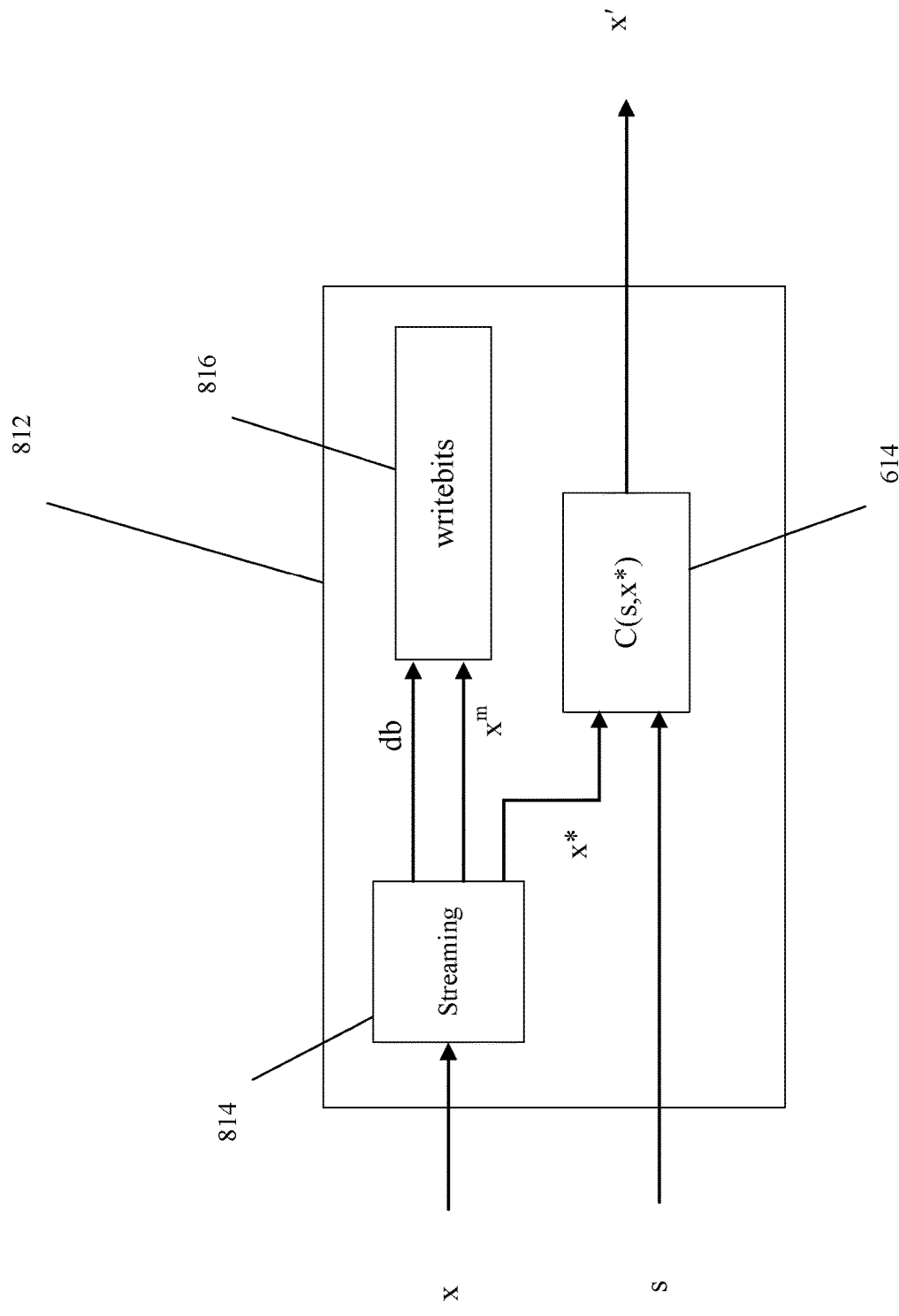
FIG. 8A is a block diagram schematically illustrating an example of a streaming encoder, in accordance with some embodiments.

FIG. 8A is a block diagram schematically illustrating an example of an encoder 812, which may be referred to as a streaming hANS encoder, in accordance with some embodiments. As can be seen in FIG. 8A, encoder 812 may include the encoding function 614, and may also include a streaming function 814 and a writebits function 816. In embodiments, the encoder 812 may receive a current state value x and a symbol s, may apply the streaming function 814 to generate a value d, an output state value x''', and an intermediate state value x*. The encoder may apply the writebits function 816 to a value db and the output state value x''' in order to write output bits to the compressed bitstream. Then, the encoder 812 may apply the encoding function 614 to the symbol s and the intermediate state value x* to generate an updated state value x'.

Figure 8B:
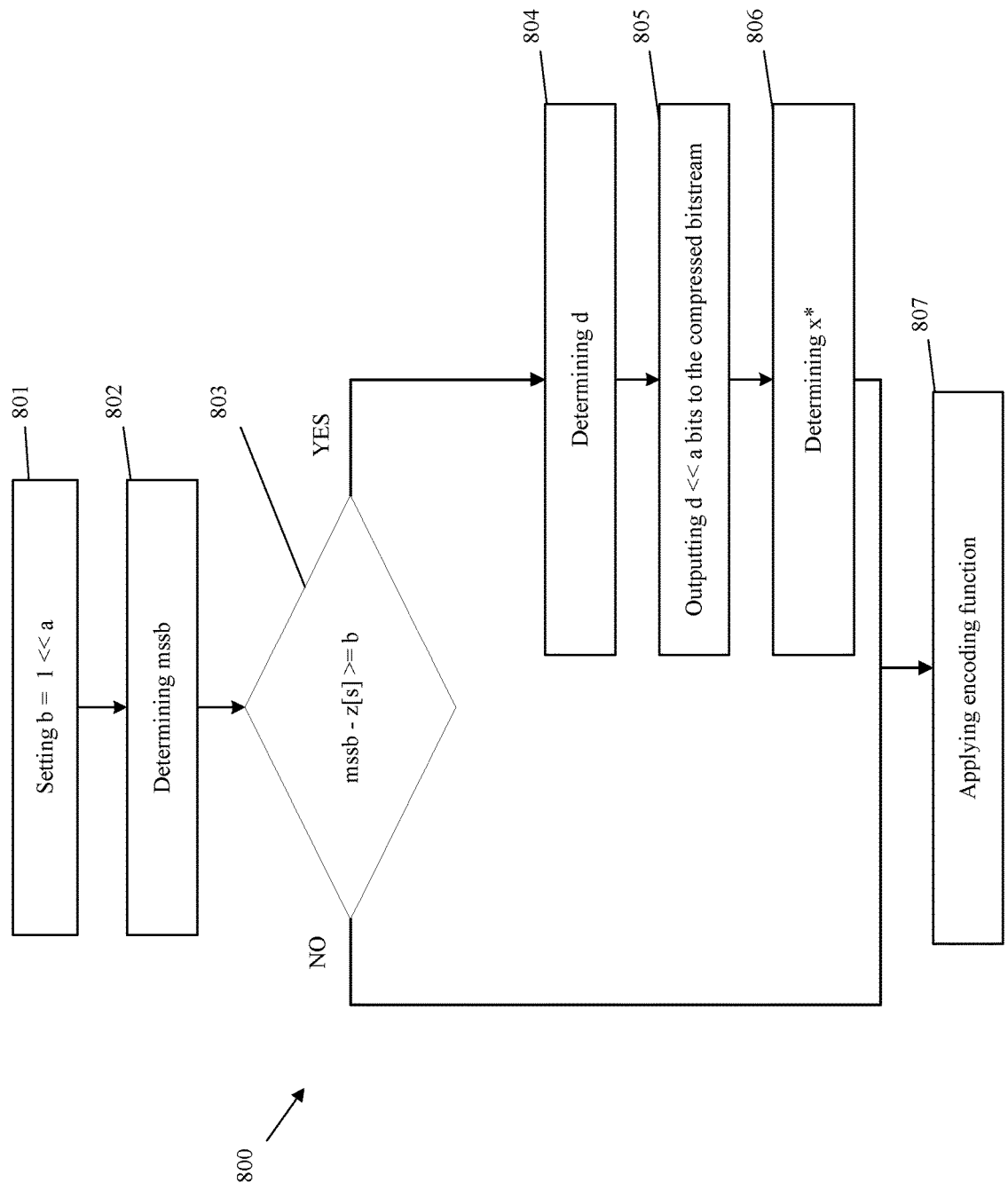
FIG. 8B is a flowchart of a process for encoding a symbol stream to generate a compressed bitstream, in accordance with some embodiments.

FIG. 8B is a flow chart of process 800 for encoding a symbol stream to generate a compressed bitstream, in accordance with some embodiments. In embodiments, process 800 may be included in, or performed in place of, operation 605 of process 600 illustrated above in FIG. 6B. In some implementations, one or more process blocks of FIG. 8B may be performed by one or more of the elements discussed above, for example one or more of the encoder 812 and the elements included therein.

As shown in FIG. 8B, process 800 may include setting a value b equal to 1<<a (operation 801). In embodiments, the value b may represent a minimum bit length of a codeword of the encoder 812, and the logarithm of the minimum bit length of the codeword may be represented as a.

As further shown in FIG. 8B, process 800 may include determining a most significant set bit of the current state value (operation 802). In embodiments, the most significant set bit may be determined according to the algorithm illustrated in FIG. 5.

As further shown in FIG. 8B, process 800 may include determining whether a difference between the most significant set bit and the log frequency value z[s] of the symbol s is greater than or equal to a value b (operation 803).

As further shown in FIG. 8B, based on the difference being less than the value b (NO at operation 803), process 600 may proceed to operation 807, which may include applying the encoding function 614 to the current state value x and the symbol s to obtain the updated state value x'. In embodiments, the updated state value x' may be used as a current state value corresponding to a next symbol.

As further shown in FIG. 8B, based on the difference being greater than or equal to the value b (YES at operation 803), process 600 may proceed to operation 804.

As further shown in FIG. 8B, process 800 may include determining a value d, which may indicate a number of blocks of b bits to be transferred out of the state value x and output to the compressed bitstream (operation 804).

As further shown in FIG. 8B, process 800 may include outputting db bits (or, for example, d<<a bits) to the compressed bitstream (operation 805). In embodiments, the encoder 812 may use the writebits function 816 to perform operation 806 based on the value d and the output state value x'''.

As further shown in FIG. 8B, process 800 may determining the intermediate state value x* (operation 806). After operation 806 is performed, process 800 may proceed to operation 807, which may include applying the encoding function 614 to the intermediate state value x* and the symbol s to obtain the updated state value x'. In embodiments, the updated state value x' may be used as a current state value corresponding to a next symbol.

FIG. 8C is a diagram illustrating an example of an algorithm for determining the number of bits db to be transferred out of the current state value x, as well as the intermediate state value x*, in accordance with some embodiments. As can be seen in FIG. 8C, the number of bits d and the intermediate state value x* may be obtained using only bitwise shift operations, bitwise subtraction operations, bitwise AND operations, and bitwise OR operations. Therefore, the multiplication operations and the while loop of the streaming rANS technique may be avoided.

Figure 9A:
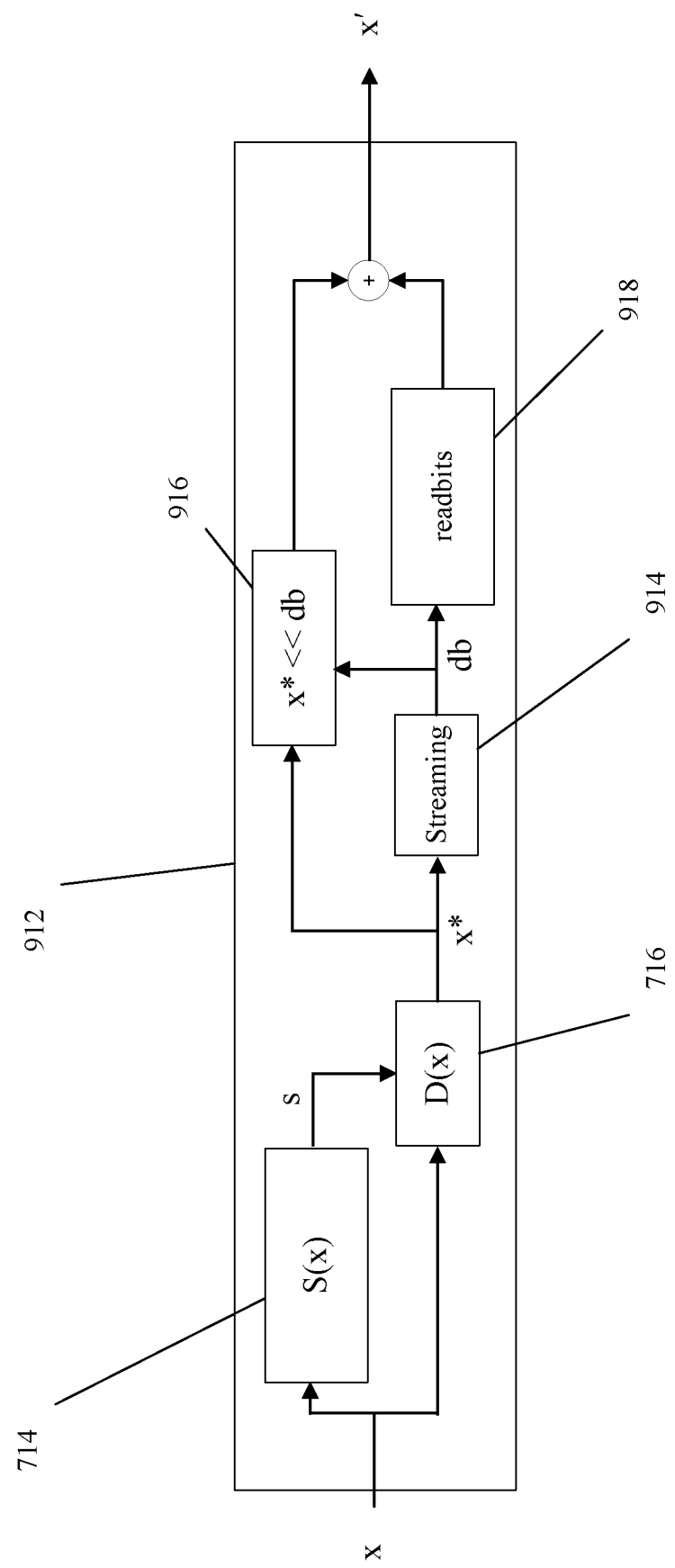
FIG. 9A is a block diagram schematically illustrating an example of a streaming decoder, in accordance with some embodiments.
Figure 9B:
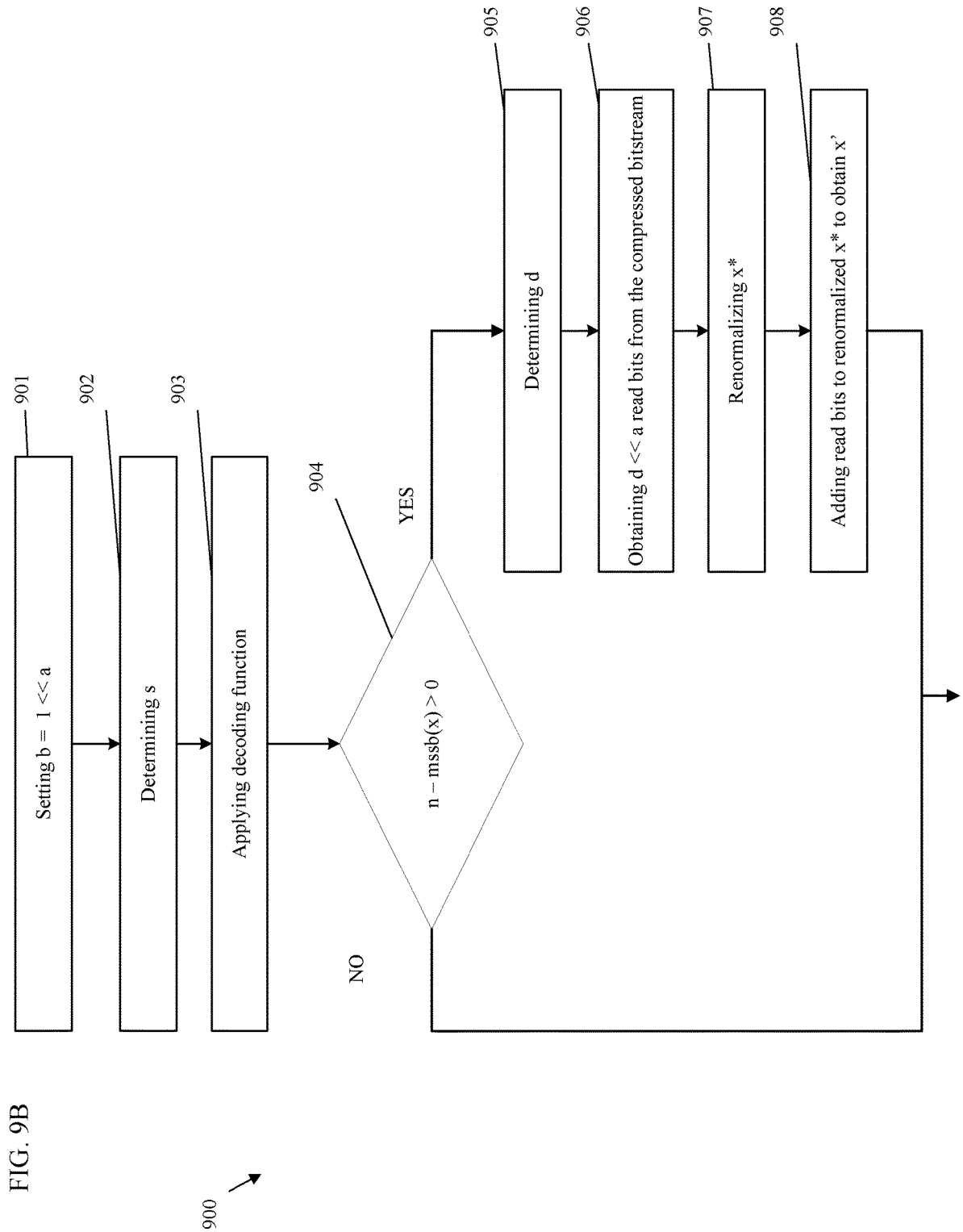
FIG. 9B is a flowchart of a process for decoding a compressed bitstream to generate a symbol stream, in accordance with some embodiments.

FIGS. 9A-9C relate to a streaming hANS decoding technique, according to some embodiments. In embodiments, the streaming hANS decoding technique may include determining a value d, which may be different from the value d described above, and which may indicate a number of bits to be transferred into the current state value x from the compressed bitstream. In embodiments, the value d may be used to avoid branching, for example the while loop as used in the streaming rANS coding technique discussed above. In embodiments, if branching is avoided, the speed of the coding process may be increased.

In embodiments, if n is an integer and x is a real number, then a relationship between the value n and the current state value x corresponding to a particular symbol s may be expressed according to Equations 37-39 below:

$$x < 2^n \qquad \text{Equation 37}$$

$$\log_2 x < n \qquad \text{Equation 38}$$

$$\lfloor \log_2 x \rfloor < n \qquad \text{Equation 39}$$

Recalling Equation 27 above, according to the streaming hANS decoding technique, a value d may be found such that Equations 40-43 below hold:

$$\lfloor \log_2 x' \rfloor \geq n \qquad \text{Equation 40}$$

$$\lfloor \log_2 x' \rfloor = \lfloor \log_2 x 2^{db} \rfloor \qquad \text{Equation 41}$$

$$\lfloor \log_2 x 2^{db} \rfloor = \lfloor \log_2 x \rfloor + db \qquad \text{Equation 42}$$

$$\lfloor \log_2 x \rfloor + db \geq n \qquad \text{Equation 43}$$

Therefore, the value d may be found according to Equations 44-45 below:

$$d \geq \frac{n - \lfloor \log_2 x \rfloor}{b} \qquad \text{Equation 44}$$

$$d = \left\lceil \frac{n - \lfloor \log_2 x \rfloor}{b} \right\rceil \qquad \text{Equation 45}$$

FIG. 9A is a block diagram schematically illustrating an example of a decoder 912, which may be referred to as a streaming hANS decoder, in accordance with some embodiments. As can be seen in FIG. 9A, decoder 912 may include the decoding function 716 and the table lookup function 714, and may also include a streaming function 914, a renormalization function 916, and a readbits function 918. In embodiments, the decoder 912 may receive a current state value x, may apply the table lookup function 714 to obtain a symbol s, and may apply the current state value x and the symbol s to the decoding function 716 to obtain an intermediate state value x*. In embodiments, the decoder 912 may apply a streaming function 914 to obtain a value d, which may indicate a number of bits to be transferred into the intermediate state value, and may apply a readbits function 918 to obtain read bits according to the value d. For example, in embodiments, the number of bits to be transferred may be db bits. In embodiments, the decoder 912 may apply a renormalization function 916 to the intermediate state value x* to obtain a renormalized state value, and may add the renormalized state value to the read bits to generate an updated state updated state value x'.

FIG. 9B is a flow chart of a process 900 for decoding a compressed bitstream to generate a symbol stream, in accordance with some embodiments. In embodiments, process 900 may be included in, or performed in place of, operation 704 of process 700 illustrated above in FIG. 7B. In some implementations, one or more process blocks of FIG. 9B may be performed by one or more of the elements discussed above, for example one or more of the decoder 912 and the elements included therein.

As shown in FIG. 9B, process 900 may include setting a value b equal to 1<<a (operation 901). In embodiments, the value b may represent a minimum bit length of a codeword of the decoder 912, and the logarithm of the minimum bit length of the codeword may be represented as a.

As further shown in FIG. 9B, process 900 may include determining a symbol s (operation 902). In embodiments, the decoder 912 may determine the symbol s by applying the table lookup function 714 to the current state value x.

As further shown in FIG. 9B, process 900 may include applying the decoding function 716 to the current state value x to obtain the intermediate state value x* (operation 903). In embodiments, the updated state value x' may be used as a current state value corresponding to a next symbol.

As further shown in FIG. 9B, process 900 may include determining whether a difference between a value of n and a most significant set bit of the current state value is greater than zero (operation 904).

As further shown in FIG. 9B, based on the difference being less than or equal to zero (NO at operation 904), process 900 may end, and the intermediate state value x* may be used as the updated state value x'.

As further shown in FIG. 9B, based on the difference being greater than zero (YES at operation 904), process 900 may include determining the value d, which may indicate the number of bits to be transferred into the intermediate state value x* (operation 905). For example, in embodiments, the number of bits to be transferred may be db bits.

As further shown in FIG. 9B, process 900 may include obtaining the db read bits (or for example d<<a read bits) from the compressed bitstream (operation 906). In embodiments, the decoder 912 may obtain the read bits using the readbits function 918 based on the value d.

As further shown in FIG. 9B, process 900 may include renormalizing the intermediate state value x* (operation 907). In embodiments, the decoder 912 may apply the renormalization function 916 to obtain the renormalized intermediate state value.

As further shown in FIG. 9B, process 900 may include adding the read bits to the renormalized intermediate state value to obtain the updated state value x' (operation 908). In embodiments, the updated state value x' may be used as a current state value corresponding to a next symbol.

FIG. 9C is a diagram illustrating an example of an algorithm for determining the value d, which may indicate the number db of bits to be transferred into the intermediate state value x*, as well as for performing the readbits function and determine the updated state value x' in accordance with some embodiments. As can be seen in FIG. 9C, the value d, the read bits, and the updated state value x' may be may be obtained using only bitwise shift operations, bitwise subtraction operations, and bitwise AND operations. Therefore, the divide operations and the while loop of the streaming rANS technique may be not used.

Figure 10:
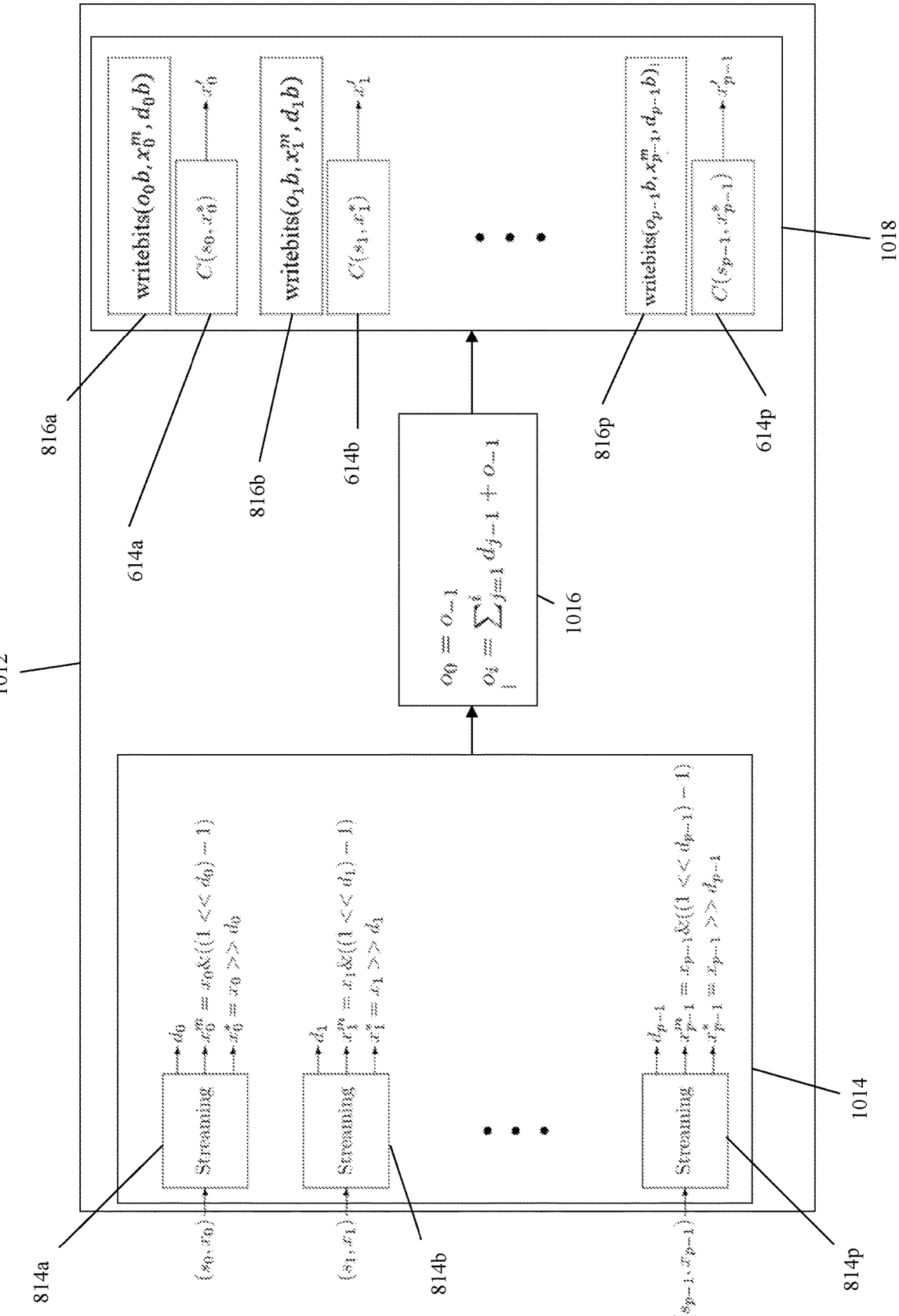
FIG. 10 is a block diagram schematically illustrating an example of a parallel encoder, in accordance with some embodiments.
Figure 11:
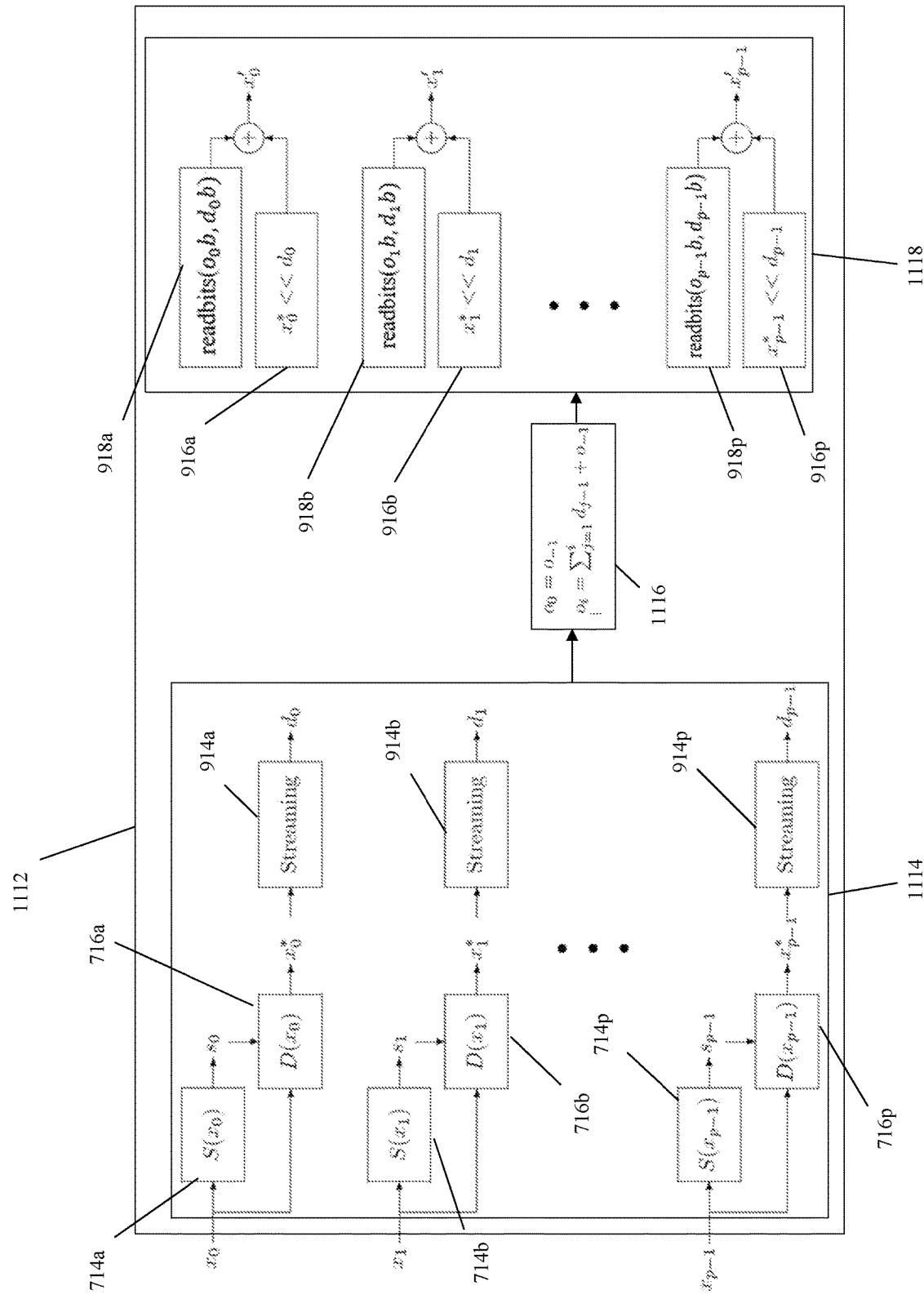
FIG. 11 is a block diagram schematically illustrating an example of a parallel decoder, in accordance with some embodiments.

As discussed above, FIGS. 10-11 relate to a parallel hANS coding technique. In embodiments, this parallel hANS coding technique may correspond to a parallel method of parallel sum to find the memory location to concurrently write/read the bits. In embodiments, the parallel version may make use of the fact that the streaming techniques discussed above keep the encoder and decoder in the same synchronized state. In FIGS. 10-11, an O(log p) parallel algorithm may be used to find a memory offset parameter o based on the value d. $o_{-1}$ may indicate the previous memory offset.

FIG. 10 is a block diagram schematically illustrating an example of an encoder 1012, which may be referred to as a parallel hANS encoder, in accordance with some embodiments. As can be seen in FIG. 10, the encoder 1012 may include a first stage 1014, a second stage 1016, and a third stage 1018. In embodiments, the first stage 1014 may include a plurality of parallel streaming functions 814a through 814p, and the third stage 1018 may include a plurality of parallel encoding functions 614a through 614p, and a plurality of parallel writebits functions 816a through 816p. In embodiments, a combination of a parallel streaming function 814i, a parallel encoding function 614i, and a parallel writebits function 816i may be referred to as a parallel encoding processor.

In embodiments, in the first stage 1014, each of the parallel encoding processors may be assigned an independent symbol, for example symbols $s_0$ through $s_{p-1}$, and an independent state, for example states $x_0$ through $x_{p-1}$. Then, in the second stage 1016, an independent memory offset, for example $o_0$ through $o_{p-1}$, may be assigned to each of the parallel decoding processors. Then, in the third stage, each of the parallel decoding processors may write bits to the compressed codeword in parallel, and generate an updated state value, for example updated state values $x'_0$ through $x'_{p-1}$.

FIG. 11 is a block diagram schematically illustrating an example of an decoder 1112, which may be referred to as a parallel hANS decoder, in accordance with some embodiments. As can be seen in FIG. 11, the decoder 1112 may include a first stage 1114, a second stage 1116, and a third stage 1118. In embodiments, the first stage 1114 may include a plurality of parallel table lookup functions 714a through 714p, a plurality of parallel decoding functions 716a through 716p, and plurality of parallel streaming functions 814a through 814p, and the third stage 1118 may include a plurality of parallel renormalization functions 916a through 916p, and a plurality of parallel readbits functions 918a through 918p. In embodiments, a combination of a parallel table lookup function 714i, a parallel decoding function 716i, a parallel streaming function 914i, a parallel renormalization function 916i, and a parallel readbits function 918i may be referred to as a parallel decoding processor.

In embodiments, in the first stage 1114, each of the parallel decoding processors may be assigned an independent symbol, for example symbols $s_0$ through $s_{p-1}$, and an independent state, for example states $x_0$ through $x_{p-1}$. Then, in the second stage 1116, an independent memory offset, for example $o_0$ through $o_{p-1}$, may be assigned to each of the parallel decoding processors. Then, in the third stage, each of the parallel decoding processors may read bits from the compressed codeword in parallel, and generate an updated state value, for example updated state values $x'_0$ through $x'_{p-1}$.

In accordance with some embodiments, the encoders and decoders discussed above may be included in one or more of the memory system 1000, the communication system 3000, or any other system or device which relates to compression and decompression or encoding and decoding of data such as digital data. For example, in accordance with some embodiments, one or more of the encoder 612, the encoder 812, and the encoder 1012 may correspond to the encoder 202 discussed above. Similarly, in accordance with some embodiments, one or more of the decoder 712, the decoder 912, and the decoder 1112 may correspond to the decoder 204 discussed above FIGS. 12A through 12C are flowcharts of processes for compressing a symbol stream for storage in a memory device, in accordance with some embodiments. In some implementations, one or more process blocks of FIGS. 12A-12C may be performed by one or more of the elements discussed above, for example one or more of the encoder 202, the encoder 612, the encoder 812, and the encoder 1012, and the elements included therein.

Figure 12A:
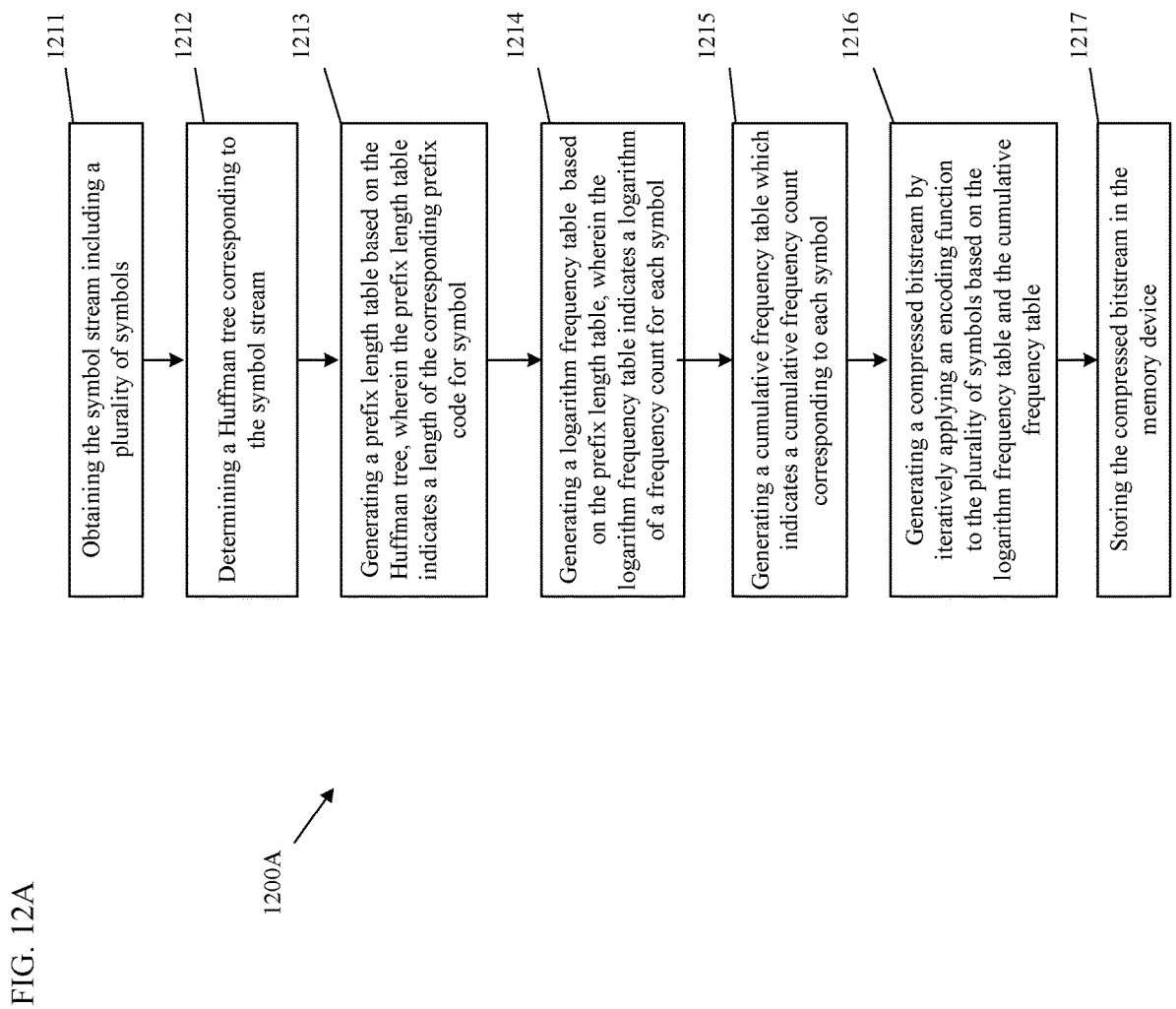
FIG. 12A through 12C are flowcharts of processes for encoding a symbol stream to generate a compressed bitstream, in accordance with some embodiments.

FIG. 12A is a flow chart of process 1200A for compressing a symbol stream for storage in a memory device, in accordance with some embodiments.

As shown in FIG. 12A, process 1200A may include obtaining the symbol stream (operation 1211). In embodiments, the symbol stream may include a plurality of symbols.

As further shown in FIG. 12A, process 1200A may include determining a Huffman tree corresponding to the symbol stream (operation 1212). In embodiments, each symbol of the plurality of symbols may be assigned a corresponding prefix code from among a plurality of prefix codes based on the Huffman tree. In embodiments, the Huffman tree may correspond to the final Huffman tree or the optimum Huffman tree discussed above. In embodiments, each symbol may correspond to a symbol s discussed above.

As further shown in FIG. 12A, process 1200A may include generating a prefix length table based on the Huffman tree (operation 1213). In embodiments, the prefix length table may indicate a length of the corresponding prefix code for each symbol.

As further shown in FIG. 12A, process 1200A may include generating a logarithm frequency table based on the prefix length table (operation 1214). In embodiments, the logarithm frequency table may indicate a logarithm of a frequency count for each symbol.

As further shown in FIG. 12A, process 1200A may include generating a cumulative frequency table (operation 1215). In embodiments, the cumulative frequency table may indicate a cumulative frequency count corresponding to each symbol. In embodiments, the cumulative frequency count may correspond to the cumulative frequency count B[s] discussed above.

As further shown in FIG. 12A, process 1200A may include generating a compressed bitstream by iteratively applying an encoding function to the plurality of symbols based on the prefix length table and the cumulative frequency table (operation 1216).

As further shown in FIG. 12A, process 1200A may include storing the compressed bitstream in the memory device (operation 1217). In embodiments, the memory device may correspond to one or more of the memory device 1000 and the memory 100 discussed above.

In embodiments, the generating of the logarithm frequency table may include subtracting the length of the corresponding prefix code for each symbol from a maximum length of the plurality of prefix codes. In embodiments, the maximum length of the plurality of prefix codes may correspond to the value n discussed above.

In embodiments, the generating of the cumulative frequency table may include obtaining the frequency count of each symbol by left shifting an integer value of 1 based on the logarithm of the frequency count for each symbol; and obtaining the cumulative frequency count for each symbol by adding the frequency count of each symbol to a sum of frequency counts of previous symbols of the plurality of symbols. In embodiments, the logarithm of the frequency count may correspond to the logarithm of the frequency count f[s] discussed above.

Figure 12B:
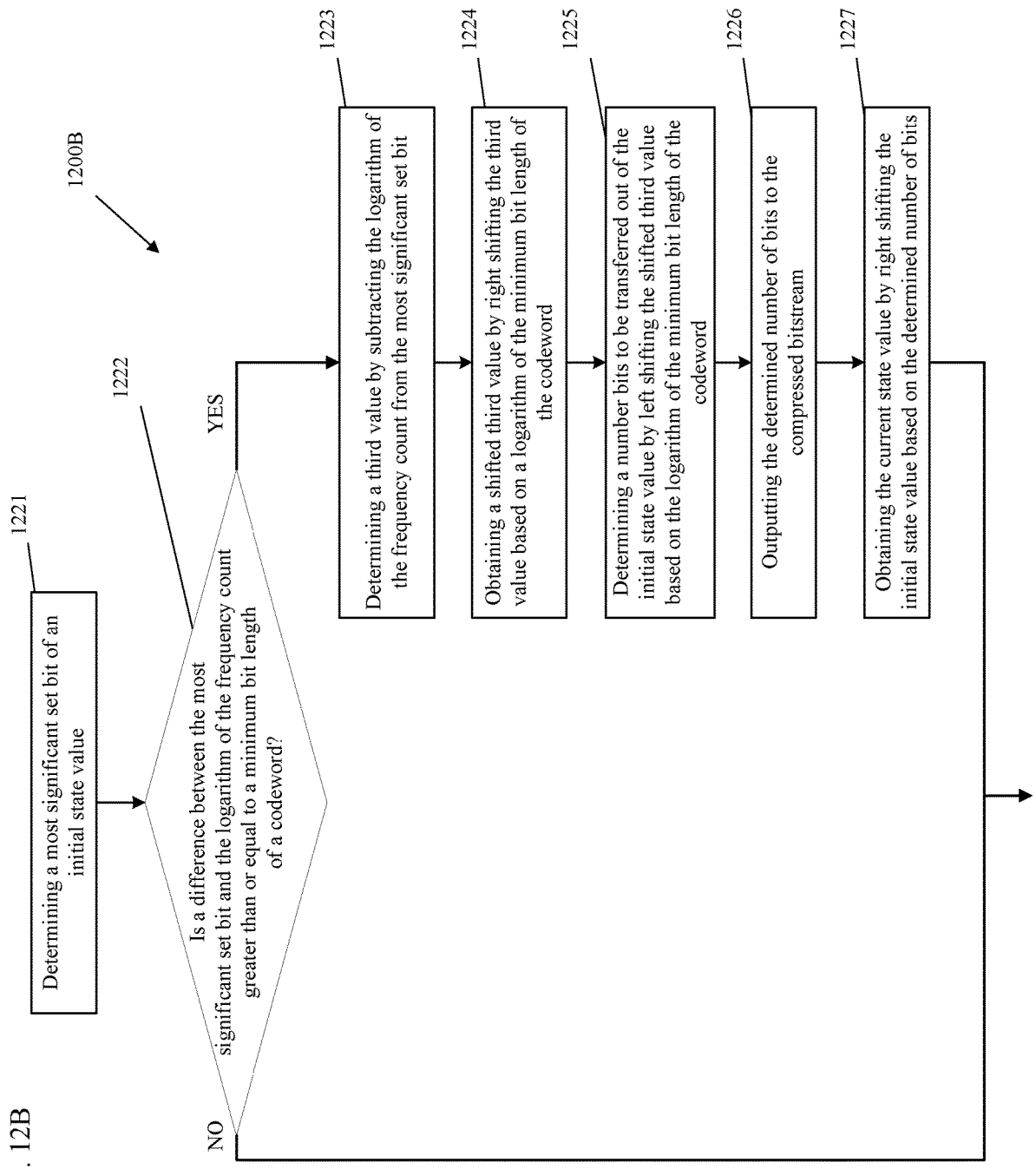

FIG. 12B is a flow chart of process 1200B for compressing a symbol stream for storage in a memory device, in accordance with some embodiments. In an embodiment, one or more of the operations of process 1200B may be combined with, included in, or performed in place of one or more operations of process 1200A. For example, one or more of the operations of process 1200B may be included in operation 1217 of process 1200A.

As shown in FIG. 12B, process 1200B may include determining a most significant set bit of an initial state value (operation 1221).

As further shown in FIG. 12B, process 1200B may include determining whether a difference between a most significant set bit of an initial state value corresponding to the symbol stream and the logarithm of the frequency count corresponding to each symbol is greater than or equal to a minimum bit length of a codeword corresponding to the symbol stream (operation 1222). In embodiments, the minimum bit length of the codeword may correspond to the value b discussed above.

As further shown in FIG. 12B, based on determining that the difference is not greater than or equal to the minimum bit length of the codeword (NO at operation 1222), process 1200B may end. In embodiments, as a result of process 1200B ending, the current state value, which may correspond to the current state value x discussed above, may be determined to be the initial state value.

As further shown in FIG. 12B, based on determining that the difference is greater than or equal to the minimum bit length of the codeword (YES at operation 1222), process 1200B may include determining a third value by subtracting the logarithm of the frequency count for each symbol from the most significant set bit (operation 1223).

As further shown in FIG. 12B, process 1200B may include obtaining a shifted third value by right shifting the third value based on a logarithm of the minimum bit length of the codeword (operation 1224). In embodiments, the logarithm of the minimum bit length of the codeword may correspond to the value a discussed above.

As further shown in FIG. 12B, process 1200B may include determining a number bits to be transferred out of the initial state value by left shifting the shifted third value based on the logarithm of the minimum bit length of the codeword (operation 1225). In embodiments, the determined number of bits may correspond to the value d<<a discussed above with respect to FIG. 8B.

As further shown in FIG. 12B, process 1200B may include outputting the determined number of bits to the compressed bitstream (operation 1226).

As further shown in FIG. 12B, process 1200B may include obtaining the current state value by right shifting the initial state value based on the determined number of bits (operation 1227). In embodiments, the current state value may correspond to the current state value x discussed above.

In embodiments, the at least one processor may include a plurality of processors, the encoding function may be applied in parallel by the plurality of processors for the plurality of symbols, to perform the encoding function, each processor of the plurality of processors may be assigned a corresponding initial state value, after each processor determines the number of bits to be transferred from the corresponding initial state value, each processor may be assigned a corresponding memory location to output the determined number of bits, and after the determined number of bits are output to the compressed bitstream, process 1200B may include determining a corresponding current state value for each processor.

Figure 12C:
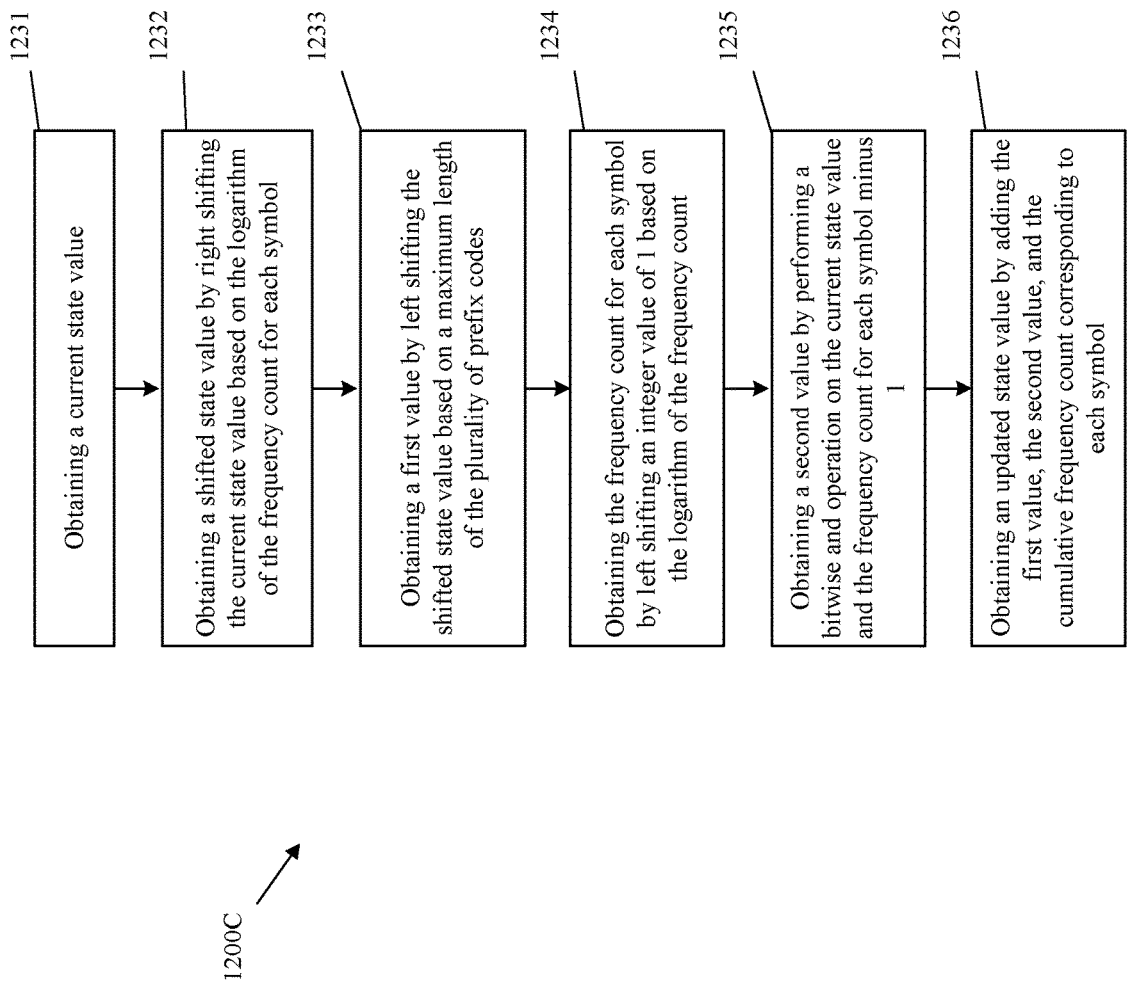

FIG. 12C is a flow chart of process 1200C for compressing a symbol stream for storage in a memory device, in accordance with some embodiments. In an embodiment, one or more of the operations of process 1200C may be combined with, included in, or performed in place of one or more operations of process 1200A. For example, one or more of the operations of process 1200C may be included in operation 1217 of process 1200A.

As shown in FIG. 12C, process 1200C may include obtaining a current state value (operation 1231). In embodiments, the current state value may correspond to the current state value x discussed above.

As further shown in FIG. 12C, process 1200C may include obtaining a shifted state value by right shifting the current state value based on the logarithm of the frequency count for each symbol (operation 1232).

As further shown in FIG. 12C, process 1200C may include obtaining a first value by left shifting the shifted state value based on a maximum length of the plurality of prefix codes (operation 1233).

As further shown in FIG. 12C, process 1200C may include obtaining the frequency count for each symbol by left shifting an integer value of 1 based on the logarithm of the frequency count (operation 1234).

As further shown in FIG. 12C, process 1200C may include obtaining a second value by performing a bitwise AND operation on the current state value and the frequency count for each symbol minus 1 (operation 1235).

As further shown in FIG. 12C, process 1200C may include obtaining an updated state by adding the first value, the second value, and the cumulative frequency count corresponding to each symbol (operation 1236). In embodiments, the updated state value may correspond to the updated state value x' discussed above.

Figure 13A:
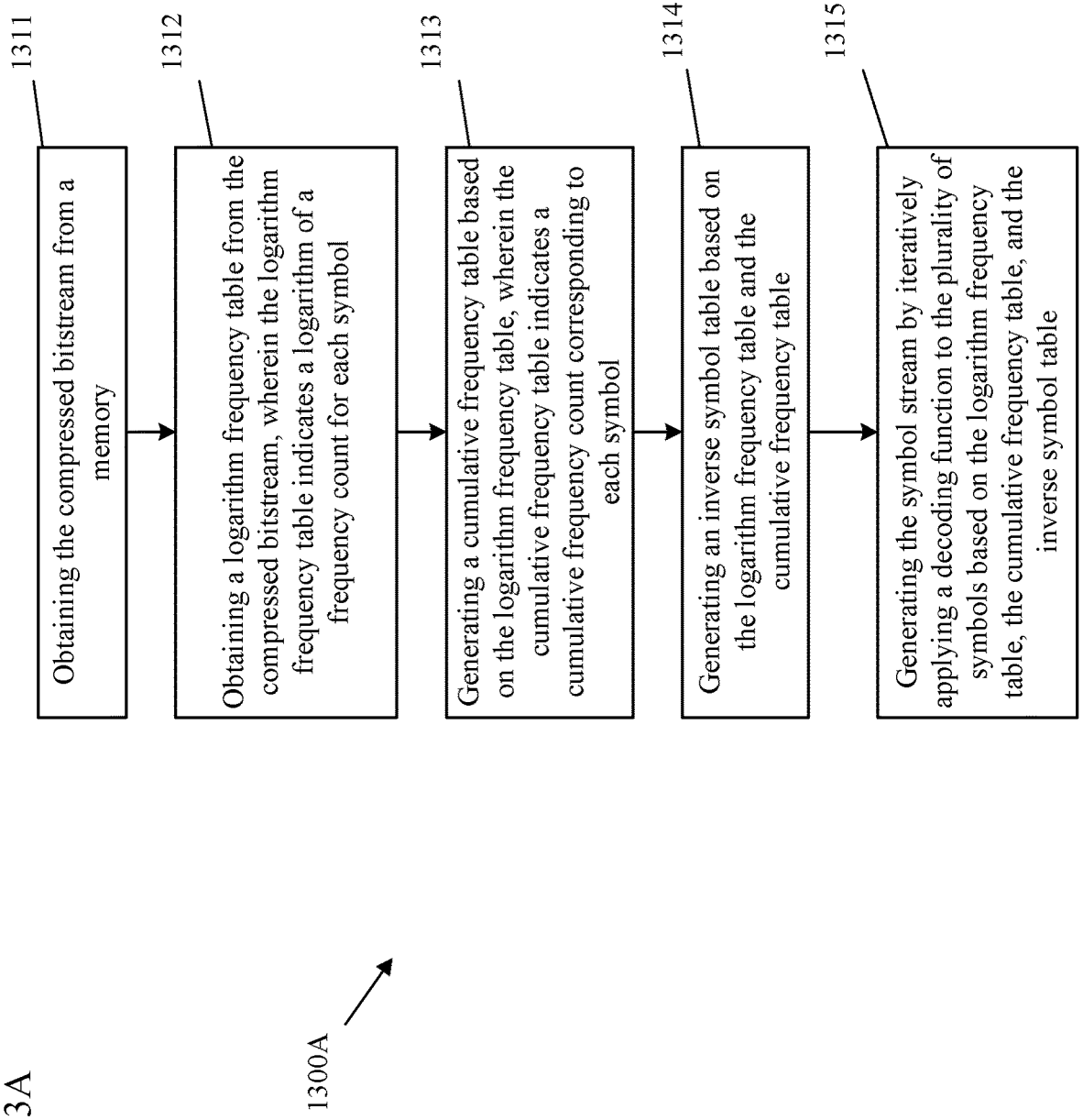
FIG. 13A through 13C are flowcharts of processes for decoding a compressed bitstream to generate a symbol stream, in accordance with some embodiments.
Figure 13B:
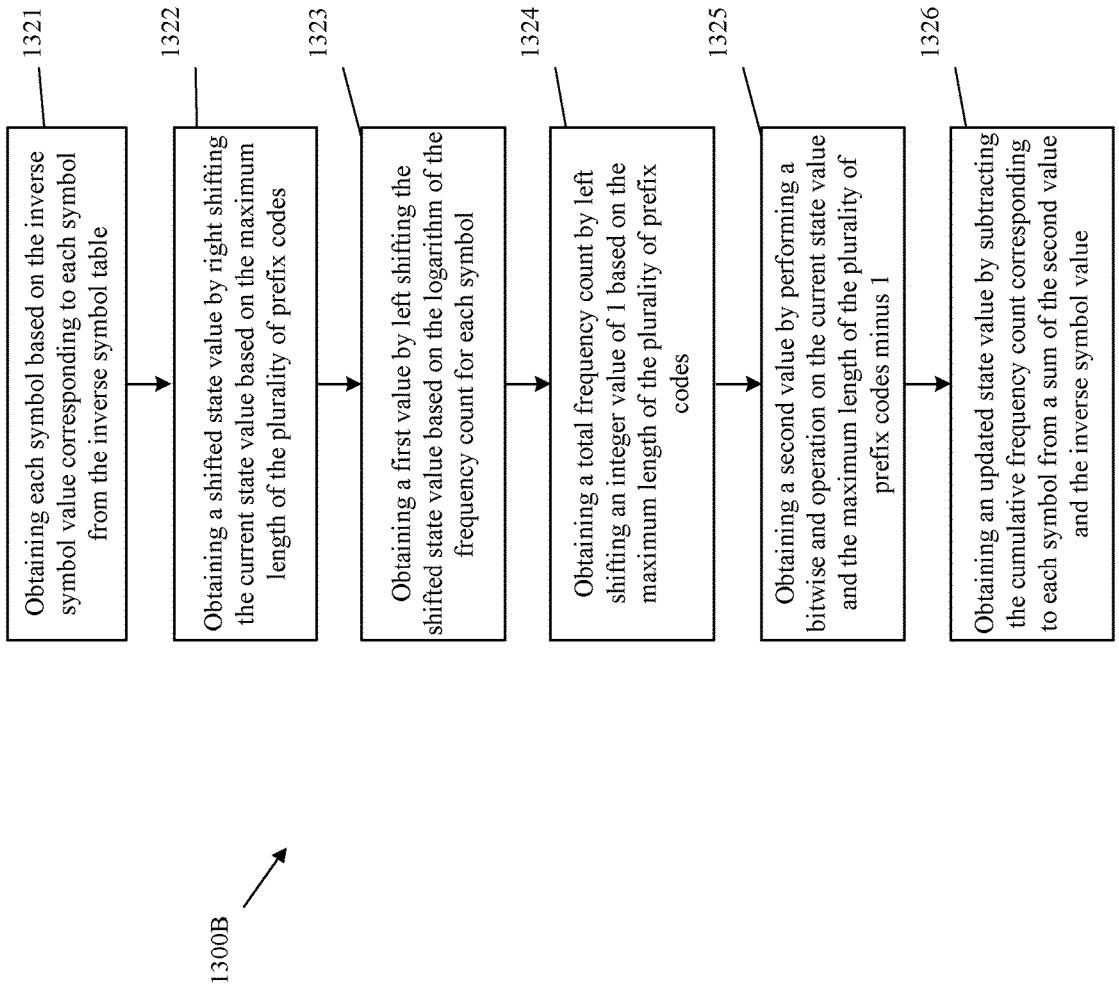
Figure 13C:
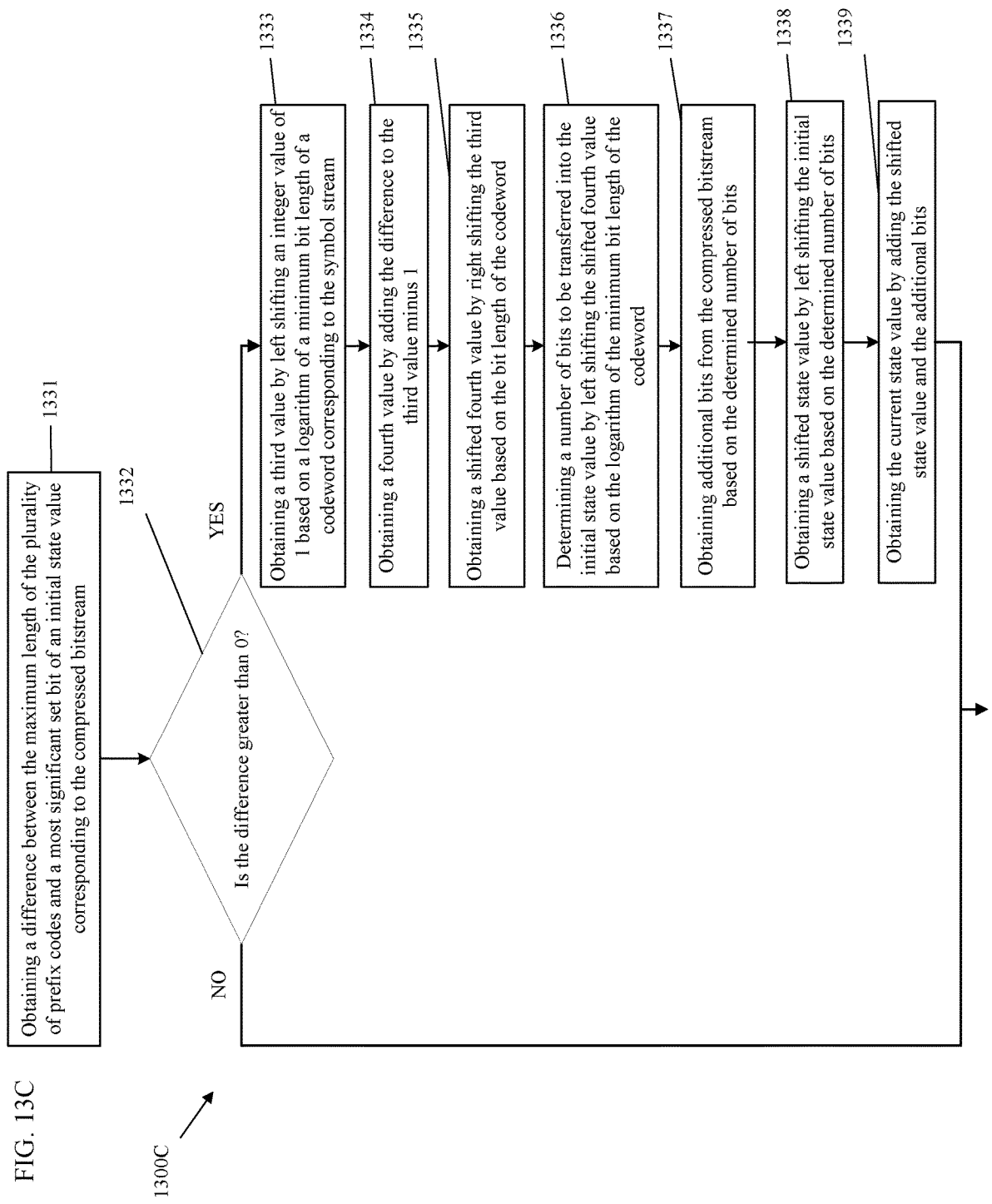

FIG. 13A through 13C are flowcharts of processes for generating a symbol stream based on a compressed bitstream, in accordance with some embodiments. In some implementations, one or more process blocks of FIGS. 13A-13C may be performed by one or more of the elements discussed above, for example one or more of the decoder 204, the decoder 712, the decoder 912, and the decoder 1112, and the elements included therein.

FIG. 13A is a flow chart of process 1300A for generating a symbol stream based on a compressed bitstream, in accordance with some embodiments.

As shown in FIG. 13A, process 1300A may include obtaining the compressed bitstream from a memory (operation 1311). In embodiments, the compressed bitstream may correspond to a plurality of symbols included in the symbol stream. In embodiments, each symbol may correspond to a symbol s discussed above.

As further shown in FIG. 13A, process 1300A may include obtaining a logarithm frequency table from the compressed bitstream (operation 1312). In embodiments, the logarithm frequency table may indicate a logarithm of a frequency count for each symbol of the plurality of symbols. In embodiments, the logarithm of the frequency count may correspond to the logarithm of the frequency count f[s] discussed above.

As further shown in FIG. 13A, process 1300A may include generating a cumulative frequency table based on the logarithm frequency table (operation 1313). In embodiments, the cumulative frequency table may indicate a cumulative frequency count corresponding to each symbol. In embodiments, the cumulative frequency count may correspond to the cumulative frequency count B[s] discussed above.

As further shown in FIG. 13A, process 1300A may include generating an inverse symbol table based on the logarithm frequency table and the cumulative frequency table (operation 1314).

As further shown in FIG. 13A, process 1300A may include generating the symbol stream by iteratively applying a decoding function to the plurality of symbols based on the cumulative frequency table and the inverse symbol table (operation 1315).

In embodiments, the generating of the cumulative frequency table may include obtaining the frequency count of each symbol by left shifting an integer value of 1 based on the logarithm of the frequency count for each symbol; and obtaining the cumulative frequency count for each symbol by adding the frequency count of each symbol to a sum of frequency counts of previous symbols of the plurality of symbols. In embodiments, the maximum length of the plurality of prefix codes may correspond to the value n discussed above.

In embodiments, the generating of the inverse symbol table may include determining, for each symbol, an inverse symbol value by performing a bitwise AND operation on a current state value and the maximum length of a plurality of prefix codes corresponding to the compressed bitstream minus 1, the inverse symbol value may be greater than or equal to the cumulative frequency count of each symbol, and the inverse symbol value may be less than a cumulative frequency count of a next symbol. In embodiments, the current state value may correspond to the current state value x discussed above.

FIG. 13B is a flow chart of process 1300B for generating a symbol stream based on a compressed bitstream, in accordance with some embodiments. In an embodiment, one or more of the operations of process 1300B may be combined with, included in, or performed in place of one or more operations of process 1300A. For example, one or more of the operations of process 1300B may be included in operation 1315 of process 1300A.

As shown in FIG. 13B, process 1300B may include obtaining each symbol based on the inverse symbol value corresponding to each symbol from the inverse symbol table (operation 1321).

As further shown in FIG. 13B, process 1300B may include obtaining a shifted state value by right shifting the current state value based on the maximum length of the plurality of prefix codes (operation 1322).

As further shown in FIG. 13B, process 1300B may include obtaining a first value by left shifting the shifted state value based on the logarithm of the frequency count for each symbol (operation 1323).

As further shown in FIG. 13B, process 1300B may include obtaining a total frequency count by left shifting an integer value of 1 based on the maximum length of the plurality of prefix codes (operation 1324).

As further shown in FIG. 13B, process 1300B may include obtaining a second value by performing a bitwise AND operation on the current state value and the maximum length of the plurality of prefix codes minus 1 (operation 1325).

As further shown in FIG. 13B, process 1300B may include obtaining an updated state value by subtracting the cumulative frequency count corresponding to each symbol from a sum of the second value and the inverse symbol value (operation 1326). In embodiments, the updated state value may correspond to the updated state value x' discussed above.

FIG. 13C is a flow chart of process 1300C for generating a symbol stream based on a compressed bitstream, in accordance with some embodiments. In an embodiment, one or more of the operations of process 1300C may be combined with, included in, or performed in place of one or more operations of process 1300A. For example, one or more of the operations of process 1300C may be included in operation 1315 of process 1300A.

As shown in FIG. 13C, process 1300C may include determining a difference between the maximum length of the plurality of prefix codes and a most significant set bit of an initial state value corresponding to the compressed bitstream (operation 1331).

As further shown in FIG. 13C, process 1300C may include determining whether the difference is greater than 0 (operation 1332).

As further shown in FIG. 13C, based on determining that the difference is not greater than 0 (NO at operation 1332), process 1300C may end. In embodiments, as a result of process 1300C ending, the current state value, which may correspond to the current state value x discussed above, may be determined to be the initial state value.

As further shown in FIG. 13C, based on determining that the difference is greater than 0 (YES at operation 1332), process 1300C may include obtaining a third value by left shifting an integer value of 1 based on a logarithm of a minimum bit length of a codeword corresponding to the symbol stream (operation 1333). In embodiments, the logarithm of the minimum bit length of the codeword may correspond to the value a discussed above.

As further shown in FIG. 13C, process 1300C may include obtaining a fourth value by adding the difference to the third value minus 1 (operation 1334).

As further shown in FIG. 13C, process 1300C may include obtaining a shifted fourth value by right shifting the third value based on the logarithm of the minimum bit length of the codeword (operation 1335).

As further shown in FIG. 13C, process 1300C may include determining a number of bits to be transferred into the initial state value by left shifting the shifted fourth value based on the logarithm of the minimum bit length of the codeword (operation 1336). In embodiments, the determined number of bits may correspond to the value d<<a discussed above with respect to FIG. 9B.

As further shown in FIG. 13C, process 1300C may include obtaining additional bits from the compressed bitstream based on the determined number of bits (operation 1337).

As further shown in FIG. 13C, process 1300C may include obtaining a shifted state value by left shifting the initial state value based on the determined number of bits (operation 1338).

As further shown in FIG. 13C, process 1300C may include obtaining the current state value by adding the shifted state value and the additional bits (operation 1339). In embodiments, the current state value may correspond to the current state value x discussed above.

Although FIGS. 6B, 7B, 8B, 9B, 12A-12C, and 13A-13C show example blocks of various processes, in some implementations, one or more of the processes may include additional blocks, fewer blocks, different blocks, or differently arranged blocks than those depicted in FIGS. 6B, 7B, 8B, 9B, 12A-12C, and 13A-13C. Additionally, or alternatively, two or more of the blocks of the illustrated processes may be performed in parallel or combined in any order.

In embodiments, the at least one processor may include a plurality of processors, the decoding function may be applied in parallel by the plurality of processors for the plurality of symbols, to perform the decoding function, each processor of the plurality of processors may be assigned a corresponding initial state value, after each processor determines the number of bits to be transferred into the corresponding initial state value, each processor may be assigned a corresponding memory location from which to obtain the additional bits, and after the additional bits are obtained from the compressed bitstream, process 1300C may include determining a corresponding current state value for each processor.

Accordingly, the above embodiments may provide a hANS coding technique which may have many benefits over other coding techniques. According to some embodiments, the hANS coding technique may have a low memory space requirement. For example, the hANS coding technique may not use an intermediate table of compression results, as used in a tANS coding technique. In embodiments, the hANS coding technique may use only a cumulative frequency table and an inverse symbol table.

According to some embodiments, the hANS coding technique may have a low complexity. For example, the hANS coding technique may not use multiplication operations or or division operations, as used in a rANS coding technique or a range coding technique. In embodiments, the hANS coding technique may be slightly more complex than a tANS coding technique because a bitwidth may be larger.

According to some embodiments, the hANS coding technique may be easily parallelizable, similar to a rANS coding technique and a tANS coding technique, and may achieve near optimum compression, similar to a Huffman coding technique.

According to some embodiments, the near optimum compression of the hANS coding technique may be within one bit per symbol, and therefore may be more useful for worst case compression than for average case compression or skewed distribution. In embodiments, the hANS coding technique may involve stack encoding/decoding, for example last-in/first-out encoding/decoding, and therefore may use special methods of reversing the symbol stream and bitstream to avoid buffering in the decoder. In embodiments, the hANS coding technique may be ideal for memory compression such as embedded memory compression.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term "component" is intended to be broadly construed as hardware, software, firmware, or a combination thereof.

It will be apparent that systems and/or methods, described herein, may be implemented in different forms of hardware, software, firmware, or a combination thereof. The actual specialized control hardware or software code used to implement these systems and/or methods is not limiting the implementations. Thus, the operation and behavior of the systems and/or methods were described herein without reference to specific software code—it being understood that software and hardware may be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

While one or more example embodiments have been described above with reference to the figures, it will be understood by those of ordinary skill in the art that various changes in form and details may be made therein without departing from the spirit and scope as defined at least in part by the following claims.

What is claimed is:

1. A memory device, comprising:

a memory; and at least one processor configured to:

obtain a symbol stream comprising a plurality of symbols, determine a Huffman tree corresponding to the symbol stream, wherein each symbol of the plurality of symbols is assigned a corresponding prefix code from among a plurality of prefix codes based on the Huffman tree, generate a prefix length table based on the Huffman tree, wherein the prefix length table indicates a length of the corresponding prefix code for each symbol, generate a logarithm frequency table based on the prefix length table, wherein the logarithm frequency table indicates a logarithm of a frequency count for each symbol, generate a cumulative frequency table which indicates a cumulative frequency count corresponding to each symbol, generate a compressed bitstream by iteratively applying an encoding function to the plurality of symbols based on the logarithm frequency table and the cumulative frequency table, and store the compressed bitstream in the memory.

2. The memory device of claim 1, wherein, to generate the logarithm frequency table, the at least one processor is further configured to subtract the length of the corresponding prefix code for each symbol from a maximum length of the plurality of prefix codes.

3. The memory device of claim 1, wherein, to generate the cumulative frequency table, the at least one processor is further configured to:

obtain the frequency count of each symbol by left shifting an integer value of 1 based on the logarithm of the frequency count for each symbol, and obtain the cumulative frequency count for each symbol by adding the frequency count of each symbol to a sum of frequency counts of previous symbols of the plurality of symbols.

4. The memory device of claim 3, wherein, to apply the encoding function to each symbol, the at least one processor is further configured to:
  obtain a current state value,
  obtain a shifted state value by right shifting the current state value based on the logarithm of the frequency count for each symbol,
  obtain a first value by left shifting the shifted state value based on a maximum length of the plurality of prefix codes,
  obtain the frequency count for each symbol by left shifting an integer value of 1 based on the logarithm of the frequency count,
  obtain a second value by performing a bitwise AND operation on the current state value and the frequency count for each symbol minus 1, and
  obtain an updated state value by adding the first value, the second value, and the cumulative frequency count corresponding to each symbol.

5. The memory device of claim 4, wherein, to apply the encoding function to each symbol, the at least one processor is further configured to:
  determine whether a difference between a most significant set bit of an initial state value corresponding to the symbol stream and the logarithm of the frequency count corresponding to each symbol is greater than or equal to a minimum bit length of a codeword corresponding to the symbol stream, and
  based on determining that the difference is greater than or equal to the minimum bit length of the codeword:
    determine a third value by subtracting the logarithm of the frequency count for each symbol from the most significant set bit,
    obtain a shifted third value by right shifting the third value based on a logarithm of the minimum bit length of the codeword,
    determine a number of bits to be transferred out of the initial state value by left shifting the shifted third value based on the logarithm of the minimum bit length of the codeword,
    output the determined number of bits to the compressed bitstream, and
    obtain the current state value by right shifting the initial state value based on the determined number of bits.

6. The memory device of claim 5, wherein the at least one processor comprises a plurality of processors configured to perform the encoding function in parallel for the plurality of symbols,
  wherein, to perform the encoding function, each processor of the plurality of processors is assigned a corresponding initial state value,
  wherein after each processor determines the number of bits to be transferred from the corresponding initial state value, each processor is assigned a corresponding memory location to output the determined number of bits, and
  wherein after the determined number of bits are output to the compressed bitstream, each processor is further configured to determine a corresponding current state value.

7. A memory device, comprising:
  a memory; and
  at least one processor configured to:
    obtain a compressed bitstream from the memory, wherein the compressed bitstream corresponds to a symbol stream comprising a plurality of symbols,
    obtain a logarithm frequency table from the compressed bitstream, wherein the logarithm frequency table indicates a logarithm of a frequency count for each symbol of the plurality of symbols,
    generate a cumulative frequency table based on the logarithm frequency table, wherein the cumulative frequency table indicates a cumulative frequency count corresponding to each symbol,
    generate an inverse symbol table based on the logarithm frequency table and the cumulative frequency table, and
    generate the symbol stream by iteratively applying a decoding function to the plurality of symbols based on the cumulative frequency table and the inverse symbol table.

8. The memory device of claim 7, wherein, to generate the cumulative frequency table, the at least one processor is further configured to:
  obtain the frequency count of each symbol by left shifting an integer value of 1 based on the logarithm of the frequency count for each symbol, and
  obtain the cumulative frequency count for each symbol by adding the frequency count of each symbol to a sum of frequency counts of previous symbols of the plurality of symbols.

9. The memory device of claim 7, wherein to generate the inverse symbol table, the at least one processor is further configured to determine, for each symbol, an inverse symbol value by performing a bitwise AND operation on a current state value and a maximum length of a plurality of prefix codes corresponding to the compressed bitstream minus 1,
  wherein the inverse symbol value is greater than or equal to the cumulative frequency count of each symbol, and
  wherein the inverse symbol value is less than a cumulative frequency count of a next symbol.

10. The memory device of claim 9, wherein, to apply the decoding function to each symbol, the at least one processor is further configured to:
  obtain each symbol based on the inverse symbol value corresponding to each symbol from the inverse symbol table,
  obtain a shifted state value by right shifting the current state value based on the maximum length of the plurality of prefix codes,
  obtain a first value by left shifting the shifted state value based on the logarithm of the frequency count for each symbol,
  obtain a total frequency count by left shifting an integer value of 1 based on the maximum length of the plurality of prefix codes,
  obtain a second value by performing a bitwise AND operation on the current state value and the maximum length of the plurality of prefix codes minus 1, and
  obtain an updated state value by subtracting the cumulative frequency count corresponding to each symbol from a sum of the second value and the inverse symbol value.

11. The memory device of claim 10, wherein, to apply the decoding function to each symbol, the at least one processor is further configured to:
  determine a difference between the maximum length of the plurality of prefix codes and a most significant set bit of an initial state value corresponding to the compressed bitstream is greater than 0, and based on determining that the difference is greater than 0:
obtain a third value by left shifting an integer value of 1 based on a logarithm of a minimum bit length of a codeword corresponding to the symbol stream,
obtain a fourth value by adding the difference to the third value minus 1,
obtain a shifted fourth value by right shifting the fourth value based on the logarithm of the minimum bit length of the codeword,
determine a number of bits to be transferred into the initial state value by left shifting the shifted fourth value based on the logarithm of the minimum bit length of the codeword,
obtain additional bits from the compressed bitstream based on the determined number of bits; and
obtain a shifted state value by left shifting the initial state value based on the determined number of bits, and
obtain the current state value by adding the shifted state value and the additional bits.

12. The memory device of claim 11, wherein the at least one processor comprises a plurality of processors configured to perform the decoding function in parallel for the plurality of symbols,
wherein, to perform the decoding function, each processor of the plurality of processors is assigned a corresponding initial state value,
wherein after each processor determines the number of bits to be transferred into the corresponding initial state value, each processor is assigned a corresponding memory location from which to obtain the additional bits, and
wherein after the additional bits are obtained from the compressed bitstream, each processor is further configured to determine a corresponding current state value.

13. A method of compressing a symbol stream for storage in a memory device, the method being performed by at least one processor and comprising:
obtaining the symbol stream comprising a plurality of symbols;
determining a Huffman tree corresponding to the symbol stream, wherein each symbol of the plurality of symbols is assigned a corresponding prefix code from among a plurality of prefix codes based on the Huffman tree;
generating a prefix length table based on the Huffman tree, wherein the prefix length table indicates a length of the corresponding prefix code for each symbol;
generating a logarithm frequency table based on the prefix length table, wherein the logarithm frequency table indicates a logarithm of a frequency count for each symbol;
generating a cumulative frequency table which indicates a cumulative frequency count corresponding to each symbol;
generating a compressed bitstream by iteratively applying an encoding function to the plurality of symbols based on the prefix length table and the cumulative frequency table; and
storing the compressed bitstream in the memory device.

14. The method of claim 13, wherein the generating of the logarithm frequency table comprises subtracting the length of the corresponding prefix code for each symbol from a maximum length of the plurality of prefix codes.

15. The method of claim 13, wherein the generating of the cumulative frequency table comprises:
obtaining the frequency count of each symbol by left shifting an integer value of 1 based on the logarithm of the frequency count for each symbol; and
obtaining the cumulative frequency count for each symbol by adding the frequency count of each symbol to a sum of frequency counts of previous symbols of the plurality of symbols.

16. The method of claim 15, wherein the applying of the encoding function to each symbol comprises:
obtaining a current state value;
obtaining a shifted state value by right shifting the current state value based on the logarithm of the frequency count for each symbol;
obtaining a first value by left shifting the shifted state value based on the maximum length of the plurality of prefix codes;
obtaining the frequency count for each symbol by left shifting an integer value of 1 based on the logarithm of the frequency count;
obtaining a second value by performing a bitwise AND operation on the current state value and the frequency count for each symbol minus 1; and
obtaining an updated state by adding the first value, the second value, and the cumulative frequency count corresponding to each symbol.

17. The method of claim 16, wherein the applying of the encoding function to each symbol further comprises:
determining whether a difference between a most significant set bit of an initial state value corresponding to the symbol stream and the logarithm of the frequency count corresponding to each symbol is greater than or equal to a minimum bit length of a codeword corresponding to the symbol stream; and
based on determining that the difference is greater than or equal to the minimum bit length of the codeword:
determining a third value by subtracting the logarithm of the frequency count for each symbol from the most significant set bit;
obtaining a shifted third value by right shifting the third value based on a logarithm of the minimum bit length of the codeword;
determining a number bits to be transferred out of the initial state value by left shifting the shifted third value based on the logarithm of the minimum bit length of the codeword;
outputting the determined number of bits to the compressed bitstream; and
obtaining the current state value by right shifting the initial state value based on the determined number of bits.

18. The method of claim 17, wherein the at least one processor comprises a plurality of processors,
wherein the encoding function is applied in parallel by the plurality of processors for the plurality of symbols,
wherein, to perform the encoding function, each processor of the plurality of processors is assigned a corresponding initial state value,
wherein after each processor determines the number of bits to be transferred from the corresponding initial state value, each processor is assigned a corresponding memory location to output the determined number of bits, and wherein after the determined number of bits are output to the compressed bitstream, the method further comprises determining a corresponding current state value for each processor.

19. A method of generating a symbol stream based on a compressed bitstream, the method being performed by at least one processor and comprising:
   obtaining the compressed bitstream from a memory, wherein the compressed bitstream corresponds to a plurality of symbols included in the symbol stream;
   obtaining a logarithm frequency table from the compressed bitstream, wherein the logarithm frequency table indicates a logarithm of a frequency count for each symbol of the plurality of symbols;
   generating a cumulative frequency table based on the logarithm frequency table, wherein the cumulative frequency table indicates a cumulative frequency count corresponding to each symbol;
   generating an inverse symbol table based on the logarithm frequency table and the cumulative frequency table; and
   generating the symbol stream by iteratively applying a decoding function to the plurality of symbols based on the cumulative frequency table and the inverse symbol table.

20. The method of claim 19, wherein the generating of the cumulative frequency table comprises:
   obtaining the frequency count of each symbol by left shifting an integer value of 1 based on the logarithm of the frequency count for each symbol; and
   obtaining the cumulative frequency count for each symbol by adding the frequency count of each symbol to a sum of frequency counts of previous symbols of the plurality of symbols.

21. The method of claim 19, wherein the generating of the inverse symbol table further comprises determining, for each symbol, an inverse symbol value by performing a bitwise AND operation on a current state value and a maximum length of a plurality of prefix codes corresponding to the compressed bitstream minus 1,
   wherein the inverse symbol value is greater than or equal to the cumulative frequency count of each symbol, and
   wherein the inverse symbol value is less than a cumulative frequency count of a next symbol.

22. The method of claim 21, wherein the applying of the decoding function to each symbol comprises:
   obtaining each symbol based on the inverse symbol value corresponding to each symbol from the inverse symbol table;
   obtaining a shifted state value by right shifting the current state value based on the maximum length of the plurality of prefix codes;
   obtaining a first value by left shifting the shifted state value based on the logarithm of the frequency count for each symbol;
   obtaining a total frequency count by left shifting an integer value of 1 based on the maximum length of the plurality of prefix codes;
   obtaining a second value by performing a bitwise AND operation on the current state value and the maximum length of the plurality of prefix codes minus 1; and
   obtaining an updated state value by subtracting the cumulative frequency count corresponding to each symbol from a sum of the second value and the inverse symbol value.

23. The method of claim 22, wherein the applying of the decoding function to each symbol further comprises:
   determining whether a difference between the maximum length of the plurality of prefix codes and a most significant set bit of an initial state value corresponding to the compressed bitstream is greater than 0;
   based on determining that the difference is greater than 0:
      obtaining a third value by left shifting an integer value of 1 based on a logarithm of a minimum bit length of a codeword corresponding to the symbol stream;
   obtaining a fourth value by adding the difference to the third value minus 1;
      obtaining a shifted fourth value by right shifting the third value based on the logarithm of the minimum bit length of the codeword,
      determining a number of bits to be transferred into the initial state value by left shifting the shifted fourth value based on the logarithm of the minimum bit length of the codeword;
      obtaining additional bits from the compressed bitstream based on the determined number of bits;
      obtaining a shifted state value by left shifting the initial state value based on the determined number of bits; and
      obtaining the current state value by adding the shifted state value and the additional bits.

24. The method of claim 23, wherein the at least one processor includes a plurality of processors,
   wherein the decoding function is applied in parallel by the plurality of processors for the plurality of symbols,
   wherein, to perform the decoding function, each processor of the plurality of processors is assigned a corresponding initial state value,
   wherein after each processor determines the number of bits to be transferred into the corresponding initial state value, each processor is assigned a corresponding memory location from which to obtain the additional bits, and
   wherein after the additional bits are obtained from the compressed bitstream, the method further comprises determining a corresponding current state value for each processor.

* * * * *